(12) United States Patent
Wang et al.

(10) Patent No.: US 7,566,937 B2
(45) Date of Patent: Jul. 28, 2009

(54) MOS TRANSISTOR INCLUDING MULTI-WORK FUNCTION METAL NITRIDE GATE ELECTRODE, COMS INTEGRATED CIRCUIT DEVICE INCLUDING SAME, AND RELATED METHODS OF MANUFACTURE

(75) Inventors: XiaoQuan Wang, Suwon-si (KR); Shigenobu Maeda, Sungnam-si (KR); Min-Joo Kim, Anyang-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 146 days.

(21) Appl. No.: 11/391,377

(22) Filed: Mar. 29, 2006

(65) Prior Publication Data

US 2006/0244079 A1   Nov. 2, 2006

(30) Foreign Application Priority Data

Apr. 29, 2005   (KR) ............... 10-2005-0036416

(51) Int. Cl.
*H01L 29/76* (2006.01)
(52) U.S. Cl. .................... 257/407; 257/412
(58) Field of Classification Search ........ 257/407, 257/412, 369, 347, 607, 915
See application file for complete search history.

(56) References Cited

U.S. PATENT DOCUMENTS 4,084,172 A * 4/1978 Scranton et al. ......... 257/473
6,300,182 B1 * 10/2001 Yu ...................... 438/217
6,528,399 B1   3/2003 Alieu et al.
6,586,808 B1   7/2003 Xiang et al.
6,664,153 B2 * 12/2003 Ang et al. ............... 438/197
6,815,285 B2 * 11/2004 Choi et al. ............... 438/231

FOREIGN PATENT DOCUMENTS

| JP | 07147398 | 6/1995 |
| JP | 11-026765 | 1/1999 |
| JP | 2002-289852 | 10/2002 |
| KR | 1020000041466 A | 7/2000 |
| KR | 20010058547 | 7/2001 |

\* cited by examiner

*Primary Examiner*—Mark Prenty
(74) *Attorney, Agent, or Firm*—Volentine & Whitt, PLLC

(57) ABSTRACT

Disclosed is a MOS transistor including a multi-work function metal nitride gate electrode. The MOS transistor comprises a semiconductor substrate and a central gate electrode formed on the semiconductor substrate. The central gate electrode is formed of a metal nitride layer. A source side gate electrode and a drain side gate electrode are formed on respective opposite sidewalls of the central gate electrode. The source and drain side gate electrodes are composed of doped metal nitride containing first impurities having an electronegativity less than that of nitrogen or second impurities having an electronegativity greater than that of nitrogen.

36 Claims, 14 Drawing Sheets

MOS TRANSISTOR INCLUDING MULTI-WORK FUNCTION METAL NITRIDE GATE ELECTRODE, COMS INTEGRATED CIRCUIT DEVICE INCLUDING SAME, AND RELATED METHODS OF MANUFACTURE

BACKGROUND OF THE INVENTION

1. Field of the Invention

The present invention relates generally to a metal-oxide semiconductor (MOS) transistor and related methods of manufacture. More particularly, the present invention relates to a MOS transistor including a multi-work function metal nitride gate electrode, a complementary metal-oxide semiconductor (CMOS) integrated circuit device including the same, and related methods of manufacture.

A claim of priority is made to Korean Patent Application No. 10-2005-0036416, filed on Apr. 29, 2005, the disclosure of which is hereby incorporated by reference in its entirety.

2. Description of Related Art

Modern semiconductor devices typically include large numbers of active devices such as MOS transistors. As the level of integration in the semiconductor devices increases, the size of the MOS transistors tends to decrease accordingly. As a result, the channel length of MOS transistors tends to be reduced. Unfortunately, as the channel length of MOS transistors decreases, the MOS transistors become increasingly susceptible to the short channel effect, which can significantly impair the performance of the semiconductor devices.

In order to suppress the short channel effect, a halo ion implantation technique is commonly used. In the halo ion implantation technique, impurity ions having the same conductivity type as a channel region of the MOS transistor are implanted into opposing edges of the channel region below a gate electrode of the MOS transistor using a tilted ion implantation process. As a result, the impurity concentration in the opposing edges of the channel region increases to prevent the threshold voltage of the MOS transistor from abruptly decreasing due to the short-channel effect. Unfortunately, where the halo ion implantation technique is used to fabricate short channel MOS transistors, current drivability of the short channel MOS transistors may be degraded. This is because the halo ion implantation technique leads to an increase in the impurity concentration of opposing edges of the channel region. Accordingly, in order to address the problem created by the halo ion implantation technique, a gate electrode including at least two conductive layers having work functions different from each other is used in high-performance short channel MOS transistors.

A MOS transistor employing the multi-work function gate electrode and a method of manufacturing the same are disclosed, for example, in U.S. Pat. No. 6,586,808 B1 to Xiang et al. (hereafter, Xiang). According to Xiang, a source region and a drain region are formed in a semiconductor layer and a gate electrode is formed on a channel region between the source region and drain regions. The gate electrode includes a pair of side gate electrodes adjacent to the source and drain regions and a central gate electrode between the side gate electrodes. The side gate electrodes are formed of a material layer having a work function different from that of the central gate electrode. For example, the central gate electrode is typically formed of any one of a silicon layer, a silicon-germanium (Si—Ge) layer, a metal layer and a metal compound layer, and the side gate electrodes are also typically formed of any one of a silicon layer, a silicon-germanium (Si—Ge) layer, a metal layer and a metal compound layer.

In Xiang, two separated anisotropic etching steps are required in order to form the side gate electrodes and gate spacers on outer sidewalls of the side gate electrodes. The an isotropic etching steps may cause severe etching damage to the channel region, thereby degrading a junction leakage current characteristic of the source and drain regions. Furthermore, it is difficult to form high-performance CMOS integrated circuit devices including an N conductivity type, metal-oxide semiconductor (NMOS) or a P conductivity type, metal-oxide semiconductor (PMOS) transistors using the techniques disclosed in Xiang. This is because Xiang requires complicated processes to form side gate electrodes with two different material layers for the NMOS and PMOS transistors.

Another method of manufacturing a MOS transistor having a multi-work function gate electrode is disclosed, for example, in U.S. Pat. No. 6,528,399 B1 to Alieu et al. (hereafter, Alieu). According to Alieu, an initial gate electrode comprising a silicon layer or a silicon layer containing a small amount of germanium is formed on a semiconductor substrate. An outer germanium layer is formed on at least the sidewalls of the initial gate electrode, and the substrate having the outer germanium layer is annealed to diffuse germanium atoms of the outer germanium layer into edges of the initial gate electrode. As a result, a central gate electrode composed of a silicon layer and side gate electrodes including a silicon germanium layer are formed.

The silicon germanium gate electrodes (e.g., the side gate electrodes) have a work function lower than that of the silicon gate electrode (e.g., the central gate electrode). Therefore, the gate electrode according to Alieu can suppress the short channel effect in PMOS transistors. Unfortunately, however, it may be difficult to apply the gate electrode of Alieu to NMOS transistors.

SUMMARY OF THE INVENTION

According to one embodiment of the invention, a metal-oxide semiconductor (MOS) transistor comprises a semiconductor substrate and a central gate electrode formed on the semiconductor substrate, wherein the central gate electrode comprises metal nitride. The transistor further comprises a source side gate electrode and a drain side gate electrode formed on opposite sidewalls of the central gate electrode, wherein the source and drain side gate electrodes comprise doped metal nitride containing first impurities having an electronegativity less than that of nitrogen or second impurities having an electronegativity greater than that of nitrogen, and wherein the source and drain side gate electrodes have respective work functions which are different from a work function of the central gate electrode. The transistor still further comprises a source region formed in the semiconductor substrate, the source region being formed adjacent to the source side gate electrode and located opposite the drain side gate electrode, and, a drain region formed in the semiconductor substrate, the drain region being disposed adjacent to the drain side gate electrode and located opposite the source side gate electrode.

According to another embodiment of the invention, a complementary metal-oxide semiconductor (CMOS) integrated circuit device comprises a semiconductor substrate having a first region and a second region, a first source region and a first drain region formed in the first region, and a first channel region formed between the first source region and the first drain region. The device further comprises a first metal nitride gate electrode formed on the first channel region, the first metal nitride gate electrode including a first source side gate electrode formed adjacent to the first source region, a first drain side gate electrode formed adjacent to the first drain region, and a first central gate electrode formed between the first source side gate electrode and the first drain side gate electrode. The first source side gate electrode and the first drain side gate electrode typically contain first impurities having an electronegativity less than that of nitrogen and a work function greater than that of the first central gate electrode. The device still further comprises a second source region and a second drain region formed in the second region, and a second channel region formed between the second source region and the second drain region, and a second metal nitride gate electrode formed on the second channel region, the second metal nitride gate electrode including a second source side gate electrode formed adjacent to the second source region, a second drain side gate electrode formed adjacent to the second drain region, and a second central gate electrode formed between the second source side gate electrode and the second drain side gate electrode, wherein the second source side gate electrode and the second drain side gate electrode contain second impurities having an electronegativity greater than that of nitrogen and a work function less than that of the second central gate electrode.

According to still another embodiment of the invention, a complementary metal-oxide semiconductor (CMOS) integrated circuit device comprises a semiconductor substrate having a first region and a second region, and a first fin body protruding upward from the semiconductor substrate and formed in the first region. The device further comprises a first source region and a first drain region formed in the first fin body and a first channel region formed in the first fin body between the first source region and the first drain region, and a first metal nitride gate electrode formed to cover opposite sidewalls and a top surface of the first channel region, the first metal nitride gate electrode including a first source side gate electrode adjacent to the first source region, a first drain side gate electrode adjacent to the first drain region, and a first central gate electrode between the first source side gate electrode and the first drain side gate electrode, wherein the first source side gate electrode and the first drain side gate electrode contain first impurities having an electronegativity less than that of nitrogen and a work function greater than that of the first central gate electrode. The device still further comprises a second fin body protruding upward from the semiconductor substrate and formed in the second region, and a second source region and a second drain region formed in the second fin body, and a second channel region formed in the second fin body between the second source region and the second drain region. The device still further comprises a second metal nitride gate electrode formed to cover opposite sidewalls and a top surface of the second channel region, wherein the second metal nitride gate electrode comprises a second source side gate electrode adjacent to the second source region, a second drain side gate electrode adjacent to the second drain region, and a second central gate electrode between the second source side gate electrode and the second drain side gate electrode. The second source side gate electrode and the second drain side gate electrode contain second impurities having an electronegativity greater than that of nitrogen and a work function less than that of the second central gate electrode.

According to still another embodiment of the present invention, a method of fabricating a MOS transistor comprises preparing a semiconductor substrate, and forming a gate insulation layer on the semiconductor substrate. The method further comprises forming a gate pattern on the gate insulation layer, wherein the gate pattern includes at least a metal nitride layer pattern contacting the gate insulation layer. The method still further comprises implanting first impurities having an electronegativity less than that of nitrogen or second impurities having an electronegativity greater than that of nitrogen on opposite sides of the gate pattern to form a source side gate electrode and a drain side gate electrode in respective opposite sides of the metal nitride layer pattern and to define a central gate electrode between the source side gate electrode and the drain side gate electrode, wherein the source side gate electrode and the drain side gate electrode both have a work function different from that of the central gate electrode, and wherein the central gate electrode, the source side gate electrode, and the drain side gate electrode constitute a metal nitride gate electrode. The method still further comprises forming a source region and a drain region on respective opposite sides of a channel region under the metal nitride gate electrode, wherein the source region is formed in the semiconductor substrate adjacent to the source side gate electrode and the drain region is formed in the semiconductor substrate adjacent to the drain side gate electrode.

According to still another embodiment of the present invention, a method of fabricating a complementary metal-oxide semiconductor (CMOS) integrated circuit device comprises preparing a semiconductor substrate having a first region and a second region, and forming an isolation layer in a predetermined region of the semiconductor layer to define first and second active regions in the first and second regions, respectively. The method further comprises forming a gate insulation layer on the first and second active regions, and forming first and second gate patterns crossing over the first and second active regions, respectively, wherein the first and second gate patterns include respective first and second metal nitride layer patterns contacting the gate insulation layer. The method still further comprises selectively implanting first impurities having an electronegativity less than that of nitrogen into opposite sides of the first gate pattern to form a first source side gate electrode and a first drain side gate electrode in respective opposite sides of the first metal nitride layer pattern and to simultaneously define a first central gate electrode between the first source side gate electrode and the first drain side gate electrode, wherein the first source side gate electrode and the first drain side gate electrode are formed to cross over the first active region. The method still further comprises selectively implanting second impurities having an electronegativity greater than that of nitrogen into opposite sides of the second gate pattern to form a second source side gate electrode and a second drain side gate electrode in respective opposite sides of the second metal nitride layer pattern and to simultaneously define a second central gate electrode between the second source side gate electrode and the second drain side gate electrode, wherein the second source side gate electrode and the second drain side gate electrode are formed to cross over the second active region.

According to still another embodiment of the invention, a method of fabricating a CMOS integrated circuit device comprises preparing a semiconductor substrate having a first region and a second region, and etching a predetermined region of the semiconductor substrate to form first and second fin bodies protruding upward from the semiconductor substrate in the respective first and second regions. The method further comprises forming a gate insulation layer on respective surfaces of the first and second fin bodies. The method still further comprises forming first and second gate patterns crossing over the respective first and second fin bodies, wherein the first and second gate patterns include at least first and second metal nitride layer patterns respectively contacting the gate insulation layer. The method still further comprises selectively implanting first impurities having an electronegativity less than that of nitrogen into opposite sides of the first gate pattern to form a first source side gate electrode and a first drain side gate electrode in respective opposite sides of the first metal nitride layer pattern and to define a first central gate electrode between the first source side gate electrode and the first drain side gate electrode, wherein the first source side gate electrode and the first drain side gate electrode cross over the first fin body. The method still further comprises implanting second impurities having an electronegativity greater than that of nitrogen into opposite sides of the second gate pattern to form a second source side gate electrode and a second drain side gate electrode in respective opposite sides of the second metal nitride layer pattern and to define a second central gate electrode between the second source side gate electrode and the second drain side gate electrode, wherein the second source side gate electrode and the second drain side gate electrode cross over the second fin body.

BRIEF DESCRIPTION OF THE DRAWINGS

The invention is described below in relation to several embodiments illustrated in the accompanying drawings. Throughout the drawings like reference numbers indicate like exemplary elements, components, or steps, and the thickness of layers is exaggerated for clarity. In the drawings.

DESCRIPTION OF EXEMPLARY EMBODIMENTS

Exemplary embodiments of the invention are described below with reference to the corresponding drawings. These embodiments are presented as teaching examples. The actual scope of the invention is defined by the claims that follow.

Figure 1:
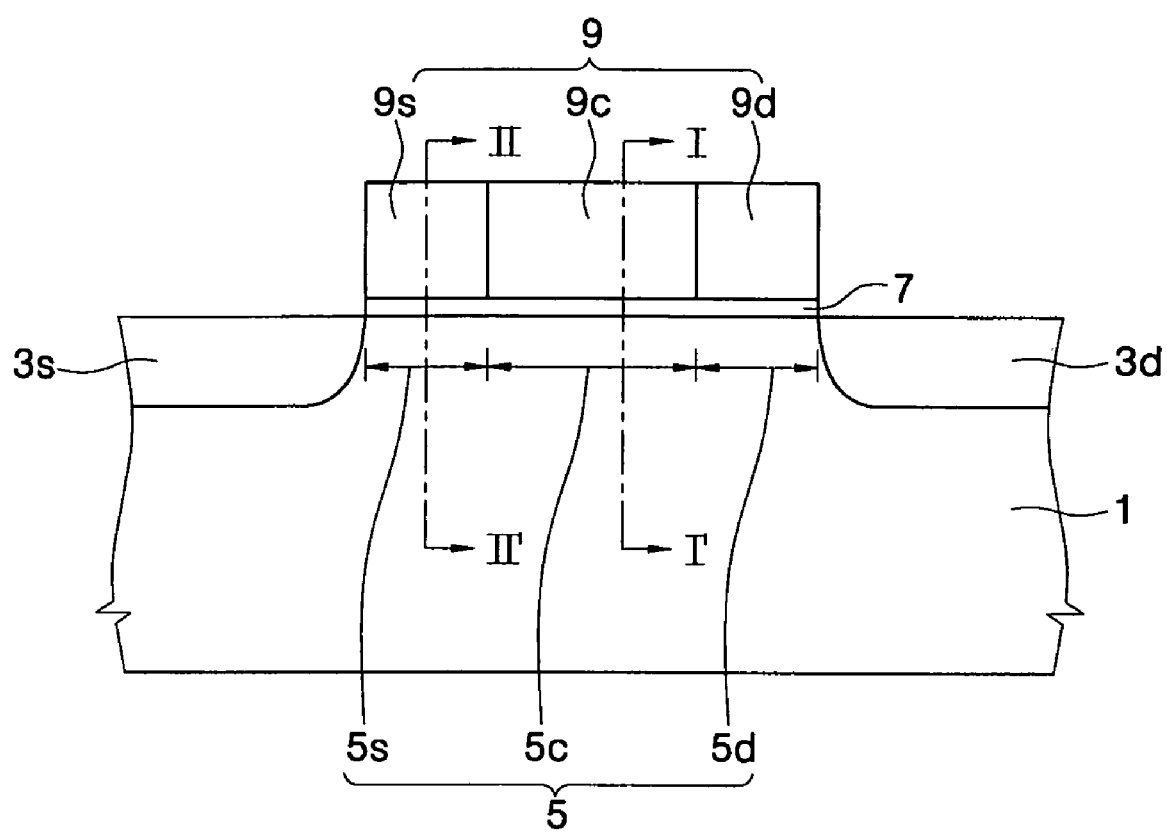
FIG. 1 is a cross-sectional view illustrating a typical MOS transistor having a multi-work function gate electrode.

FIG. 1 is a cross-sectional view illustrating a typical MOS transistor having a multi-work function gate electrode.

Referring to FIG. 1, a source region 3s and a drain region 3d are formed in a semiconductor substrate 1. A channel region 5 is formed in a region of semiconductor substrate 1 between source region 3s and drain region 3d. A gate electrode 9 is formed on channel region 5, and a gate insulation layer 7 is formed between gate electrode 9 and channel region 5. Gate electrode 9 comprises a source side gate electrode 9s adjacent to source region 3s and a drain side gate electrode 9d adjacent to the drain region 3d as well as a central gate electrode 9c between source side gate electrode 9s and drain side gate electrode 9d. Channel region 5 is typically divided into a source side channel region 5s under source side gate electrode 9s, a central channel region 5c under central gate electrode 9c and a drain side channel region 5d under drain side gate electrode 9d.

Source side gate electrode 9s and drain side gate electrode 9d constitute side gate electrodes which have different work functions from central gate electrode 9c. For example, where the MOS transistor shown in FIG. 1 is a NMOS transistor, side gate electrodes 9s and 9d typically have a work function greater than that of central gate electrode 9c. In contrast, where the MOS transistor shown in FIG. 1 is a PMOS transistor, side gate electrodes 9s and 9d typically have a work function less than that of central gate electrode 9c.

Figure 2A:
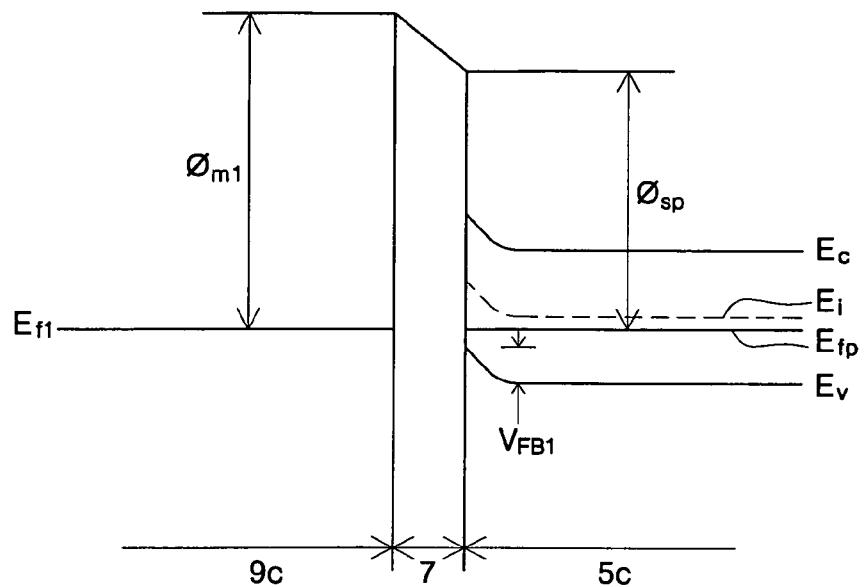
FIG. 2A is an energy band diagram illustrating a threshold voltage of a central gate electrode in a NMOS transistor having the structure shown in FIG. 1.
Figure 2B:
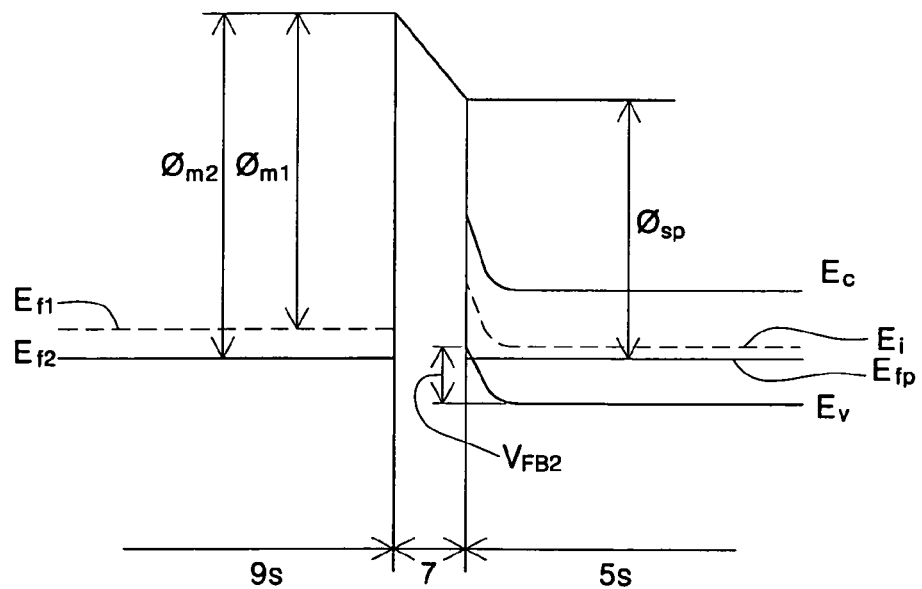
FIG. 2B is an energy band diagram illustrating a threshold voltage of a side gate electrode in a NMOS transistor having the structure shown in FIG. 1.

FIG. 2A is an energy band diagram of central gate electrode 9c and central channel region 5c taken along a line I-I' in FIG. 1 for a case where the MOS transistor shown in FIG. 1 is a NMOS transistor. FIG. 2B is an energy band diagram of source side gate electrode 9s, and source side channel region 5s taken along a line II-II' in FIG. 1 when the MOS transistor shown in FIG. 1 is a NMOS transistor. In FIGS. 2A and 2B, reference characters "$E_c$", "$E_v$" and "$E_i$" respectively denote a conduction band, a valence band and a mid-gap band of the channel region. For explanation purposes, it will be assumed that source side gate electrode 9s has the same work function as drain side gate electrode 9d. However, in reality, they could have different work functions.

Referring to FIGS. 2A and 2B, where an ion implantation process such as a halo ion implantation process is not applied to side channel regions 5s and 5d, side channel regions 5s and 5d generally have the same impurity concentration as central channel region 5c. For example, side channel regions 5s and 5d and central channel region 5c may form a P-type semiconductor substrate having a uniform impurity concentration. In such a case, a work function ($\Phi_{m1}$) of central gate electrode 9c may be greater than a work function $\Phi_{sp}$ of channel regions 5c, 5s and 5d, and a work function $\Phi_{m2}$ of source side gate electrode 9s, (i.e., a "side gate work function") may be greater than central gate work function $\Phi_{m1}$. In this case, the Fermi level "$E_{f1}$" of central gate electrode 9c is generally the same as the Fermi level "$E_{fp}$" of central channel region 5c in a thermal equilibrium state, and the Fermi level "$E_{f2}$" of side gate electrode 9s is generally the same as the Fermi level "$E_{fp}$" of side channel region 5s in a thermal equilibrium state. As a result, respective valence and conduction bands "$E_v$" and "$E_c$" of central channel region 5c are typically bent as shown in FIG. 2A to have a first flat band voltage "$V_{FB1}$" at the surface of central channel region 5c, and respective valence and conduction bands "$E_v$" and "$E_c$" of side channel region 5s may be bent as shown in FIG. 2B to have a second flat band voltage $V_{FB2}$ at the surface of side channel region 5s.

Second flat band voltage $V_{FB2}$ may be higher than first flat band voltage $V_{FB1}$. This is because side gate work function $\Phi_{m2}$ is greater than central gate work function $\Phi_{m1}$ as described above. Accordingly, a side threshold voltage for inverting side channel regions 5s and 5d into an N-type region is higher than a central threshold voltage for inverting central channel region 5c into an N-type region. In other words, it is possible to remarkably suppress the short channel effect which is due to the drain induced barrier lowering (DIBL) even though the length of the central channel region 5c reduces. In sum, if side gate work function $\Phi_{m2}$ is greater than central gate work function $\Phi_{m1}$, the short channel effect of the NMOS transistor can be mitigated without using the halo ion implantation process. In addition, since the halo ion implantation process is not performed, side channel regions 5s and 5d have the same impurity concentration as central channel region 5c. Thus, the current drivability of the NMOS transistor can be prevented from being degraded.

Figure 3A:
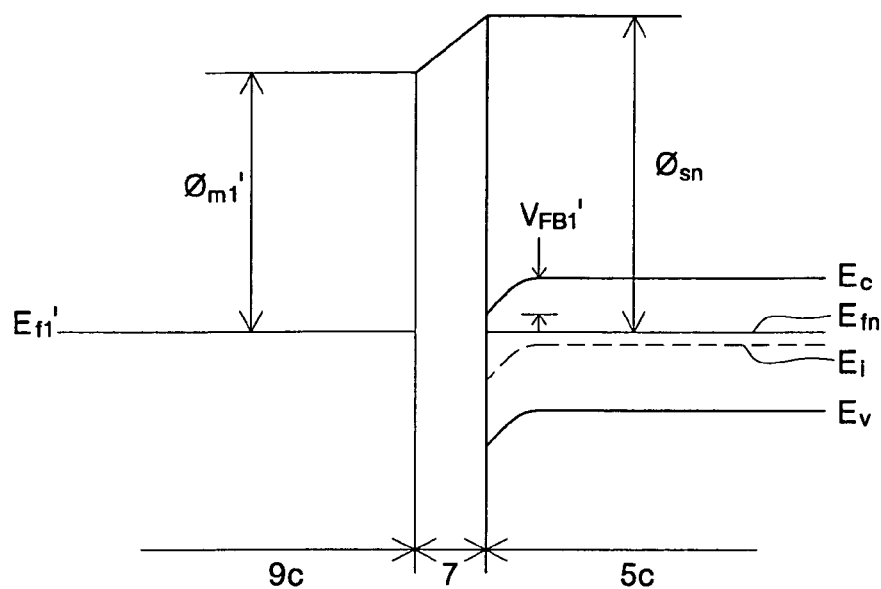
FIG. 3A is an energy band diagram illustrating a threshold voltage of a central gate electrode in a PMOS transistor having the structure shown in FIG. 1.
Figure 3B:
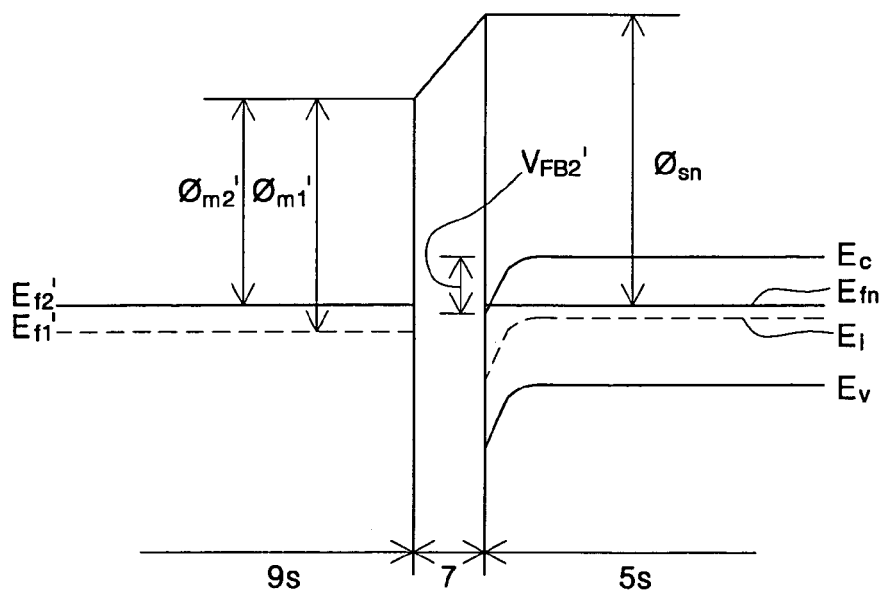
FIG. 3B is an energy band diagram illustrating a threshold voltage of a side gate electrode in a PMOS transistor having the structure shown in FIG. 1.

FIG. 3A is an energy band diagram of central gate electrode 9c and central channel region 5c, taken along the line I-I' in FIG. 1, when the MOS transistor shown in FIG. 1 is a PMOS transistor. FIG. 3B is an energy band diagram of side gate electrode 9s and side channel region 5s taken along the line II-II' in FIG. 1, when the MOS transistor shown in FIG. 1 is a PMOS transistor. In FIGS. 3A and 3B, reference characters "$E_c$", "$E_v$" and "$E_i$" respectively denote a conduction band, a valence band, and a mid-gap band of the channel region. For explanation purposes, it is assumed that source side gate electrode 9s has the same work function as drain side gate electrode 9d. However, in reality, they could have different work functions.

Referring to FIGS. 3A and 3B, when an ion implantation process such as a halo ion implantation process is not applied to side channel regions 5s and 5d, side channel regions 5s and 5d typically have the same impurity concentration as that of the central channel region 5c. In other words, in this case, side channel regions 5s and 5d and central channel region 5c will generally form an N-type semiconductor substrate having a uniform impurity concentration. The work function $\Phi m1'$ of central gate electrode 9c (i.e., a "central gate work function") is generally be less than the work function $\Phi_{sn}$ of channel regions 5c, 5s and 5d, and the work function $\Phi m2'$ of source side gate electrode 9s (i.e., a "side gate work function") is generally less than the central gate work function $\Phi_{m1}'$. In this case, the Fermi level $E_{f1}'$ of central gate electrode 9c has the same level as the Fermi level $E_{fn}$ of central channel region 5c in a thermal equilibrium state, and the Fermi level Ef2' of side gate electrode 9s has the same level as the Fermi level $E_{fn}$ of side channel region 5s in a thermal equilibrium state. As a result, valence band $E_{fn}$ and conduction band $E_c$ of central channel region 5c may be bent as shown in FIG. 3A to have a first flat band voltage $V_{FB1}'$ at the surface of central channel region 5c, and valence band $E_v$ and conduction band $E_c$ of side channel region 5s may be bent as shown in FIG. 3B to have a second flat band voltage $V_{FB2}'$ at the surface of side channel region 5s.

The absolute value of second flat band voltage $V_{FB2}'$ is typically greater than the absolute value of the first flat band voltage $V_{FB1}'$. This is because the side gate work function $\Phi_{m2}'$ is less than the central gate work function $\Phi_{m1}'$ as described above. Accordingly, since the absolute value of a side threshold voltage for inverting the side channel regions 5s and 5d into a P type region is greater than the absolute value of a central threshold voltage for inverting central channel region 5c into a P-type region, it is possible to remarkably suppress the short channel effect due to drain induced barrier lowering (DIBL) even though the length of central channel region 5c is reduced. In sum, where the side gate work function $\Phi_{m2}'$ is less than the central gate work function $\Phi_{m1}'$, the short channel effect of the PMOS transistor can be improved even without use of the halo ion implantation. In addition, since the halo ion implantation process is not performed, side channel regions 5s and 5d have the same impurity concentration as that of central channel region 5c. Thus, it can prevent the current drivability of the PMOS transistor from being degraded.

Figure 4:
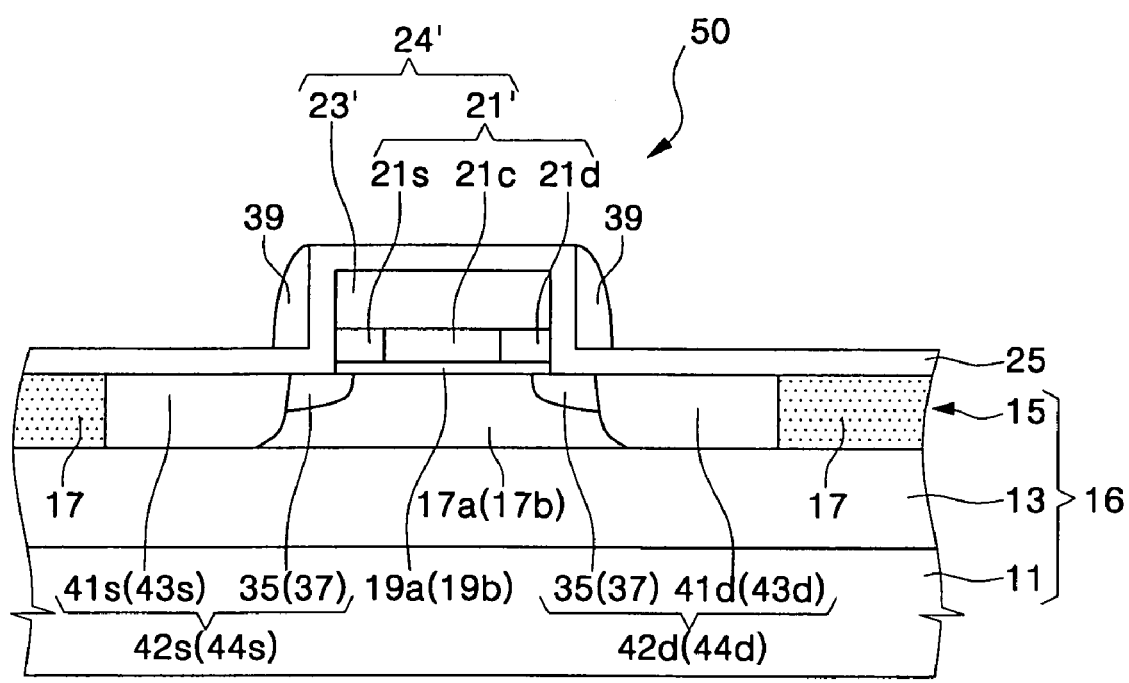
FIG. 4 is a cross-sectional view illustrating a planar MOS transistor according to an embodiment of the present invention.

FIG. 4 is a cross-sectional view illustrating a planar MOS transistor 50 according to an embodiment of the present invention.

Referring to FIG. 4, an isolation layer 17 is formed in a predetermined region of a semiconductor substrate 16 to define an active region such as a P-type active region 17a or an N-type active region 17b. Semiconductor substrate 16 typically comprises a Silicon On Insulator(SOI) substrate including a supporting substrate 11, a buried insulation layer 13 formed on supporting substrate 11 and a semiconductor layer 15 formed on buried insulation layer 13. In the embodiment shown in FIG. 4, isolation layer 17 is formed in semiconductor layer 15. Buried insulation layer 13 typically comprises a silicon oxide layer, and semiconductor layer 15 typically comprises a silicon layer. Alternatively, the semiconductor substrate 16 could comprise a bulk semiconductor substrate such as a silicon substrate.

Where MOS transistor 50 is a NMOS transistor, active region 17 generally comprises P-type active region 17a. In this case, an N-type source region 42s and an N-type drain region 42d are formed on opposing edges of P-type active region 17a. In contrast, where MOS transistor 50 is a PMOS transistor, active region 17 generally comprises N-type active region 17b. In this case, a P-type source region 44s and a P-type drain region 44d are formed on opposing edges of N-type active region 17b.

N-type source region 42s and N-type drain region 42d typically include an N-type high-concentration source region 41s and an N-type high-concentration drain region 41d, respectively. In addition, N-type source region 42s and N-type drain region 42d generally further include N-type low-concentration source and drain regions 35 which extend from N-type high-concentration source region 41s and N-type high-concentration drain region 41d respectively. N-type low-concentration source and drain regions 35 are formed adjacent to a channel region between N-type high-concentration source region 41s and N-type high-concentration drain region 41d.

P-type source region 44s and P-type drain region 44d typically include a P-type high-concentration source region 43s and a P-type high-concentration drain region 43d, respectively. In addition, P-type source region 44s and P-type drain region 44d typically further include P-type low-concentration source and drain regions 37 which extend from P-type high-concentration source region 43s and the P-type high-concentration drain region 43d respectively. P-type low-concentration source and drain regions 37 are provided adjacent to a channel region between the P-type high-concentration source region 43s and P-type high-concentration drain region 43d.

A multi-work function gate electrode 24' is formed on the channel region between source region 42s (or 44s) and drain region 42d (or 44d). Multi-work function gate electrode 24' is insulated from the channel region by a gate insulation layer 19a (or 19b). Multi-work function gate electrode 24' includes at least a metal nitride gate electrode 21' contacting gate insulation layer 19a (or 19b).

Metal nitride gate electrode 21' typically comprises a transition metal nitride layer. For example, the metal nitride gate electrode 21' may comprise a tantalum nitride layer or a titanium nitride layer. Metal nitride gate electrode 21' generally includes a source side gate electrode 21s adjacent to source region 42s (or 44s) and a drain side gate electrode 21d adjacent to drain region 42d (or 44d) as well as a central gate electrode 21c between source side gate electrode 21s and drain side gate electrode 21d.

Source side gate electrode 21s and drain side gate electrode 21d, i.e., the side gate electrodes, generally have a different work function from central gate electrode 21c. For example, where MOS transistor 50 is a NMOS transistor, side gate electrodes 21s and 21d generally have a work function greater than that of central gate electrode 21c so as to suppress the short channel effect as described with reference to FIGS. 2A and 2B. Where MOS transistor 50 is a NMOS transistor, central gate electrode 21c typically comprises an undoped metal nitride gate electrode and side gate electrodes 21s and 21d generally comprise doped metal nitride gate electrodes containing first impurities having an electronegativity less than that of nitrogen.

Alternatively, where MOS transistor 50 is a PMOS transistor, side gate electrodes 21s and 21d generally have a work function less than that of central gate electrode 21c so as to suppress the short channel effect as described with reference to FIGS. 3A and 3B. Where MOS transistor 50 is a PMOS transistor, central gate electrode 21c typically comprises an undoped metal nitride gate electrode and side gate electrodes 21s and 21d typically comprise doped metal nitride gate electrodes containing second impurities having an electronegativity greater than that of nitrogen.

A relationship between a work function of a metal layer and the electronegativity of impurities in the metal layer has been described, for example, in an article by Gotoh et al. and entitled "Measurement of Work Function of Transition Metal Nitride and Carbide Thin Films", Journal of Vacuum Society Technology B, Vol. 21, No. 4, July/August 2003, pp. 1607-1611.

In some embodiments of the present invention, since nitrogen has an electronegativity of 3.0, the first impurities may be elements having an electronegativity less than 3.0 and the second impurities may be elements having an electronegativity greater than 3.0. For example, the first impurities may be carbon ions having an electronegativity of 2.5, and the second impurities may be fluorine ions having an electronegativity of 4.0. As a result, a carbon-doped metal nitride layer may have a work function greater than that of the undoped metal nitride layer, and a fluorine-doped metal nitride layer may have a work function less than that of the undoped metal nitride layer. Therefore, when the central gate electrode is an undoped tantalum nitride layer, a carbon-doped tantalum nitride layer may be employed as the side gate electrodes of a NMOS transistor and a fluorine-doped metal nitride layer may be employed as the side gate electrodes of a PMOS transistor.

Multi-work function gate electrode 24' generally further includes a top gate electrode 23' stacked on metal nitride gate electrode 21'. In this case, metal nitride gate electrode 21' generally has a thickness of 5 Å to 20 Å, and top gate electrode 23' generally has a thickness of 1000 Å to 2000 Å. Top gate electrode 23' typically comprises a gate pattern composed of a semiconductor layer such as a silicon layer.

A gate spacer 39 is generally formed on sidewalls of multi-work function gate electrode 24'. In addition, a conformal offset insulation layer 25 is generally provided between gate spacer 39 and gate electrode 24'. Offset insulation layer 25 extends to cover a top surface of gate electrode 24', source region 42s (or 44s) and drain region 42d (or 44d). Offset insulation layer 25 typically has a thickness of 100 Å to 200 Å. In other words, offset insulation layer 25 on sidewalls of gate electrode 24' generally has a thickness of 100 Å to 200 Å along a horizontal direction parallel to the surface of semiconductor substrate 16. Offset insulation layer 25 is typically formed to control the width of an overlap between the low-concentration source and drain regions 35 (or 37) and side gate electrodes 21s and 21d.

In the event that gate spacer 39 is provided, low-concentration source and drain regions 35 (or 37) may be self-aligned with the sidewalls of gate electrode 24' and high-concentration source region 41s (or 43s) and high-concentration drain region 41d (or 43d) may be self-aligned with outer sidewalls of gate spacer 39.

Figure 5:
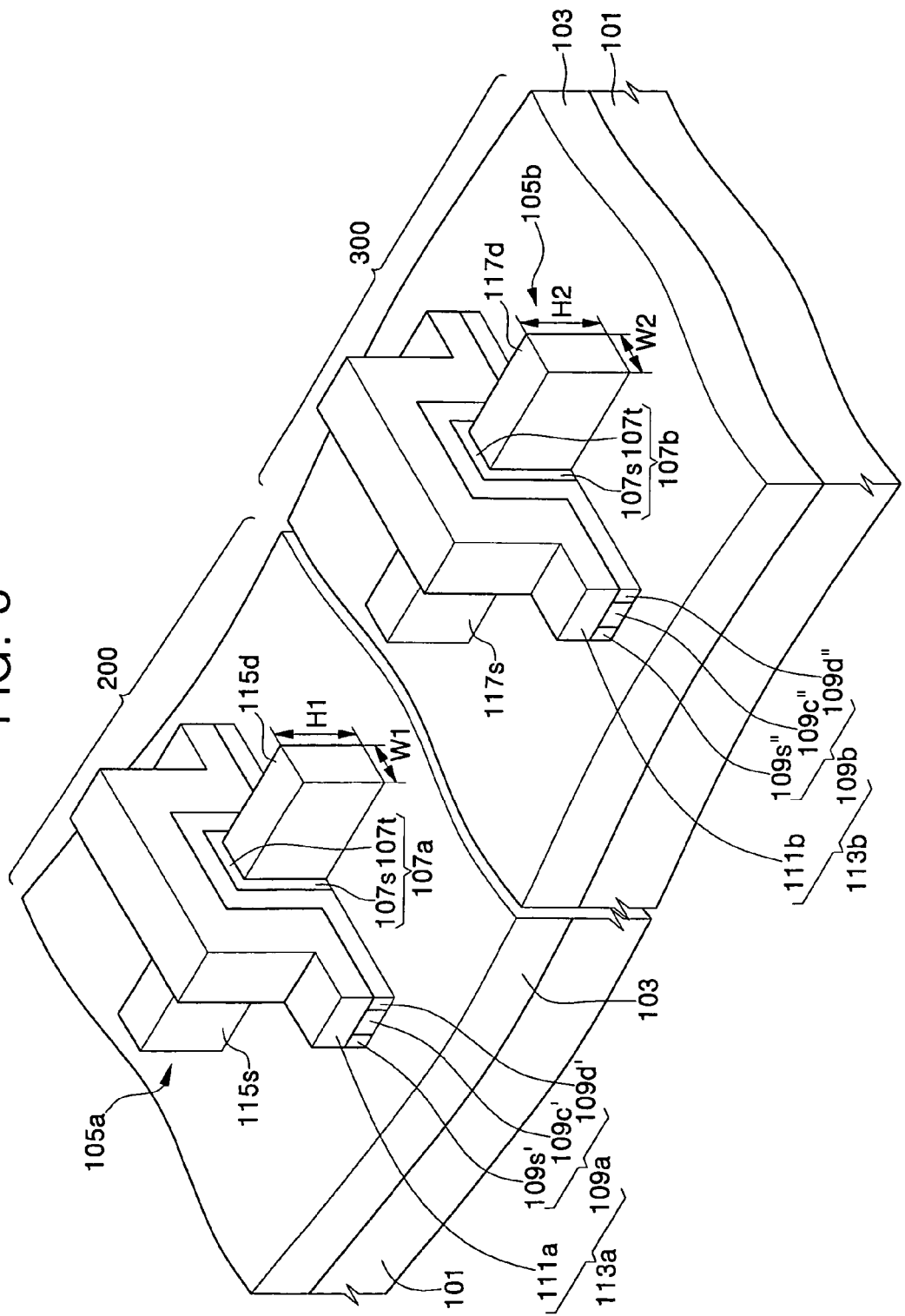
FIG. 5 is a cross-sectional view illustrating fin-type CMOS transistor according to another embodiment of the present invention.

The multi-work function gate electrode described with reference to FIG. 4 can be applied to gate electrodes of fin-type field effect transistors as illustrated in FIG. 5.

FIG. 5 is a cross-sectional view illustrating a pair of fin-type CMOS transistors according to another embodiment of the present invention.

Referring to FIG. 5, a semiconductor substrate has a first region 200 and a second region 300. The semiconductor substrate comprises a supporting substrate 101, a buried insulation layer 103 formed on supporting substrate 101 and a semiconductor layer formed on buried insulation layer 103. The semiconductor layer is patterned to form a first fin body 105a and a second fin body 105b which are respectively protruding in first and second regions 200 and 300.

In some embodiments of the present invention, the semiconductor substrate is a bulk semiconductor substrate. Where the semiconductor substrate is a bulk semiconductor substrate, first fin body 105a and second fin body 105b are defined by an isolation layer formed in a predetermined region in the bulk semiconductor substrate, and the isolation layer is recessed so that first and second fin bodies 105a and 105b protrude from the bulk semiconductor layer.

A first source region 115s and a first drain region 115d are formed on opposing sides of first fin body 105a. A portion of first fin body 105a between first source region 115s and first drain region 115d serves as a first channel region. The first channel region is covered with a first gate electrode 113a. In other words, first gate electrode 113a covers both sidewalls and a top surface of the first channel region. First gate electrode 113a is electrically insulated from the first channel region by a first gate insulation layer 107a. First gate electrode 113a generally includes at least a first metal nitride gate electrode 109a contacting first gate insulation layer 107a. In addition, first gate electrode 113a typically further includes a first top gate electrode 111a stacked on first metal nitride gate electrode 109a.

Similarly, a second source region 117s and a second drain region 117d are opposite sides of second fin body 105b. A portion of second fin body 105b between second source region 117s and second drain region 117d serves as a second channel region. The second channel region is covered with a second gate electrode 113b. In other words, second gate electrode 113b covers both sidewalls and a top surface of the second channel region. Second gate electrode 113b is electrically insulated from the second channel region by a second gate insulation layer 107b. Second gate electrode 113b generally includes at least a second metal nitride gate electrode 109b contacting second gate insulation layer 107b. In addition, second gate electrode 113b typically further includes a second top gate electrode 111b stacked on second metal nitride gate electrode 109b.

First and second top gate electrodes 111a and 111b are generally formed of the same material as top gate electrode 23' described with reference to FIG. 4. In addition, first and second metal nitride gate electrodes 109a and 109b typically have the same structure as metal nitride gate electrode 21' described with reference to FIG. 4. In other words, first metal nitride gate electrode 109a generally includes a first source side gate electrode 109s' adjacent to first source region 115s and a first drain side gate electrode 109d' adjacent to first drain region 115d as well as a first central gate electrode 109c' between first source side gate electrode 109s' and first drain side gate electrode 109d'. Similarly, second metal nitride gate electrode 109b generally includes a second source side gate electrode 109s'' adjacent to second source region 117s and a second drain side gate electrode 109d'' adjacent to second drain region 117d as well as a second central gate electrode 109c'' between second source side gate electrode 109s'' and the second drain side gate electrode 109d''.

Where first region 200 is a NMOS transistor region, first source and drain regions 115s and 115d are N-type impurity regions, and first source and drain side gate electrodes 109s' and 109d' may have a work function greater than that of first central gate electrode 109c' so as to suppress the short channel effect of the NMOS transistor as described with reference to FIG. 4. In other words, where first central gate electrode 109c' is an undoped metal nitride layer, first source and drain side gate electrodes 109s' and 109d' comprise carbon-doped metal nitride layers.

Where second region 300 is an PMOS transistor region, second source and drain regions 117s and 117d are P-type impurity regions and second source and drain side gate electrodes 109s'' and 109d'' typically have a work function less than that of second central gate electrode 109c'' so as to suppress the short channel effect of the PMOS transistor as described with reference to FIG. 4. For example, where second central gate electrode 109c'' is an undoped metal nitride layer, second source and drain side gate electrodes 109s'' and 109d'' typically comprise fluorine-doped metal nitride layers.

Each of first and second gate insulation layers 107a and 107b typically includes a sidewall gate insulation layer 107s covering sidewalls of the channel region and a top gate insulation layer 107t covering a top surface of the channel region. First fin body 105a has a first width W1 and a first height H1 and second fin body 105b has a second width W2 and a second height H2. In general, first width W1 can be the same as or different from second width W2, and first height H1 can also be the same as or different from second height H2. Where first and second widths W1 and W2 are greater than about 0.1 μm, top gate insulation layers 107t of top gate insulation layers 107a and 107b may have the same thickness as that of sidewall gate insulation layers 107s. On the other hand, where first and second widths W1 and W2 are less than about 0.1 μm, top gate insulation layers 107t of gate insulation layers 107a and 107b generally have a thickness greater than that of sidewall gate insulation layers 107s.

FIGS. 6 through 12 are cross-sectional views illustrating methods of fabricating planar CMOS transistors according to selected embodiments of the present invention.

Figure 6:
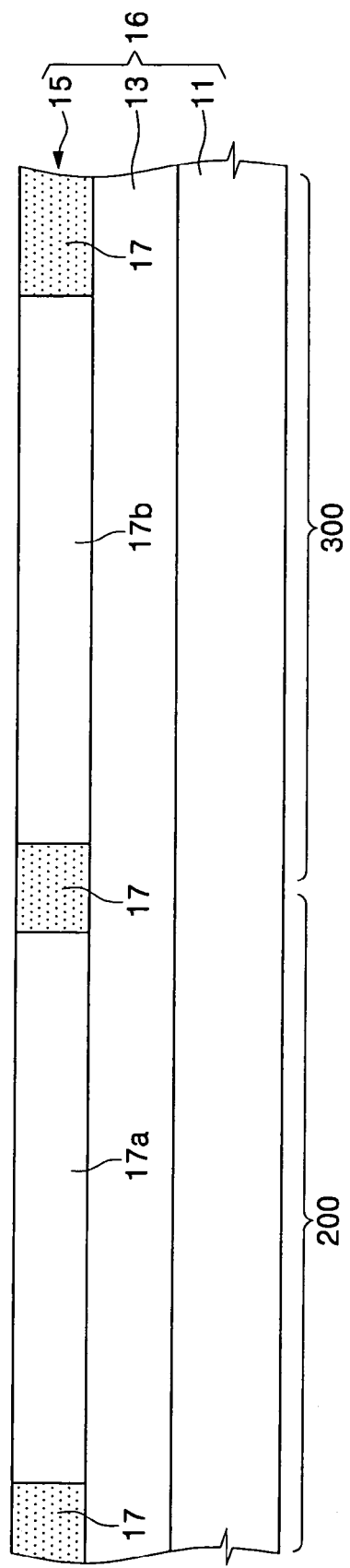
FIGS. 6 through 12 are cross-sectional views illustrating methods of fabricating planar CMOS transistors according to selected embodiments of the present invention.

Referring to FIG. 6, an isolation layer 17 is formed in a predetermined region of a semiconductor substrate 16 having a first region 200 and a second region 300, thereby defining first and second active regions 17a and 17b in the first and second regions 200 and 300, respectively. Semiconductor substrate 16 typically comprises a SOI substrate having a supporting substrate 11, a buried insulation layer 13 formed on supporting substrate 11 and a semiconductor layer 15 formed on buried insulation layer 13. Isolation layer 17 is generally formed in semiconductor layer 15. Alternatively, semiconductor substrate 16 may comprise a bulk semiconductor substrate.

Figure 7:
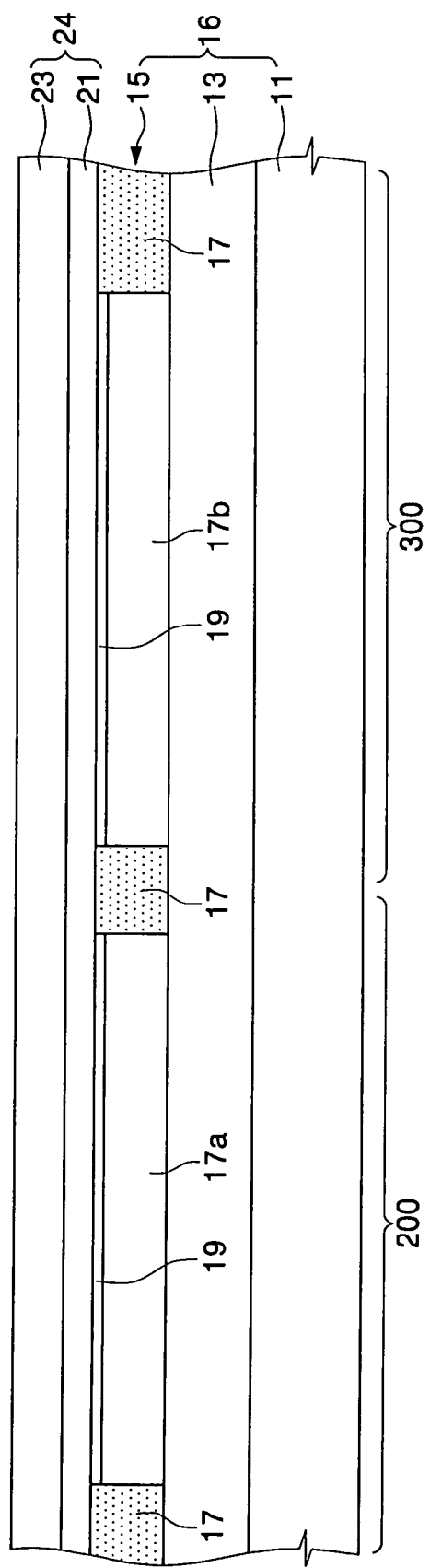

Referring to FIG. 7, a gate insulation layer 19 is formed on active regions 17a and 17b in semiconductor layer 15, and a gate conductive layer 24 is formed on semiconductor layer 15. Gate conductive layer 24 generally comprises a metal nitride layer 21. Where metal nitride layer 21 has a thickness less than 1000 Å, the height of a gate electrode formed by patterning metal nitride layer 21 in a subsequent process may be so low that it may be difficult to control a width of a gate spacer formed on sidewalls of the gate electrode and to reduce electrical resistance of the gate electrode. Accordingly, metal nitride layer 21 is preferably formed to have a thickness greater than at least 1000 Å. However, if the thickness of metal nitride layer 21 becomes too large, metal nitride layer 21 may separate from semiconductor layer 15 under high physical stress. Accordingly, gate conductive layer 24 is preferably formed by sequentially stacking metal nitride layer 21 and a top gate conductive layer 23. Metal nitride layer 21 is preferably formed to have a thickness of 5 Å to 20 Å, and top gate conductive layer 23 is preferably formed to have a thickness of 1000 Å to 2000 Å.

Metal nitride layer 21 is preferably formed of an undoped transition metal nitride layer. For example, metal nitride layer 21 may be formed of an undoped tantalum nitride layer or an undoped titanium nitride layer. In addition, top gate conductive layer 23 is typically formed of a semiconductor layer such as a silicon layer.

Figure 8:
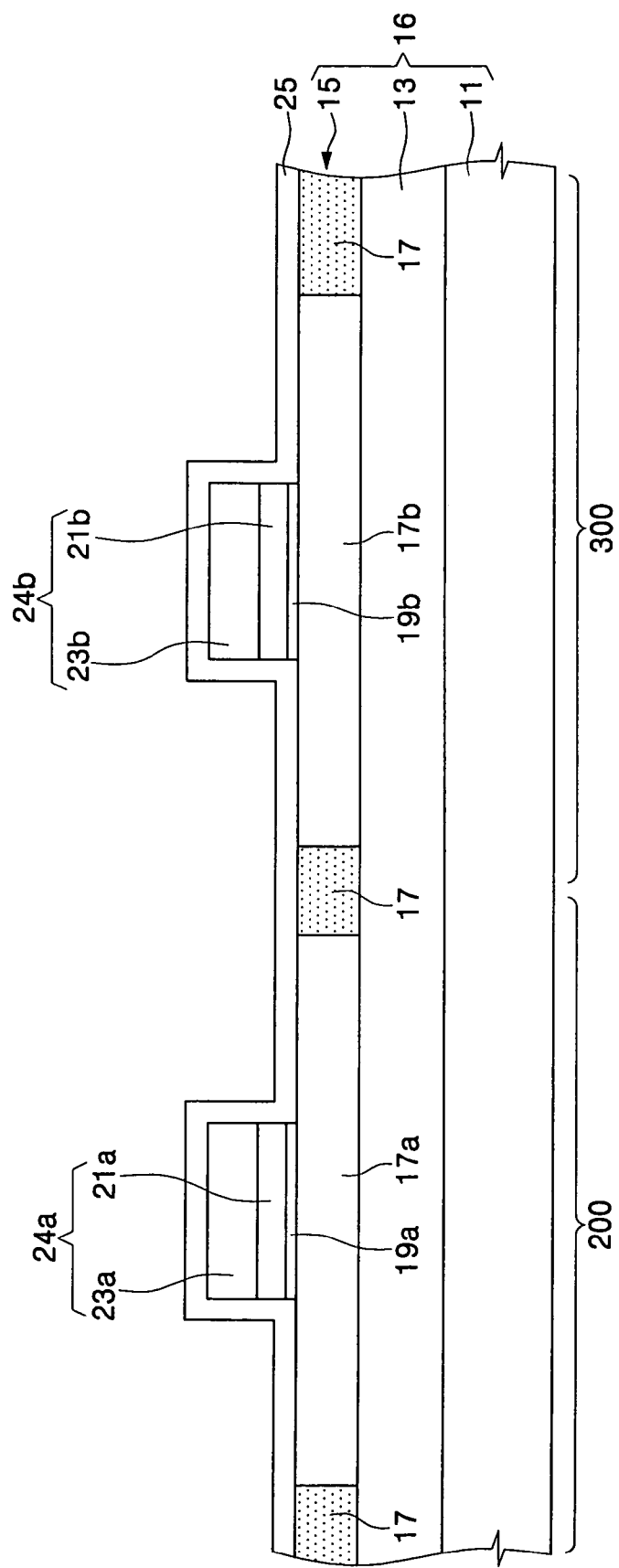

Referring to FIG. 8, gate conductive layer 24 is patterned to form a first gate pattern 24a and a second gate pattern 24b in first region 200 and second region 300, respectively. Accordingly, first gate pattern 24a is generally formed to have a first metal nitride layer pattern 21a and a first top gate electrode 23a which are sequentially stacked, and second gate pattern 24b is generally formed to have a second metal nitride layer pattern 21b and a second top gate electrode 23b which are sequentially stacked. First and second gate patterns 24a and 24b are formed to cross over first and second active regions 17a and 17b, respectively.

When gate conductive layer 24 is patterned, gate insulation layer 19 is generally etched to expose active regions 17a and 17b adjacent to gate patterns 24a and 24b, while gate conductive layer 24 is patterned. As a result, a first gate insulation layer pattern 19a generally remains under first gate pattern 24a, and a second gate insulation layer pattern 19b generally remains under second gate pattern 24b. An offset insulation layer 25 is then formed on semiconductor layer 15 over first and second gate patterns 24a and 24b. Offset insulation layer 25 is preferably formed of an insulation layer such as a silicon oxide layer or a silicon nitride layer.

Figure 9:
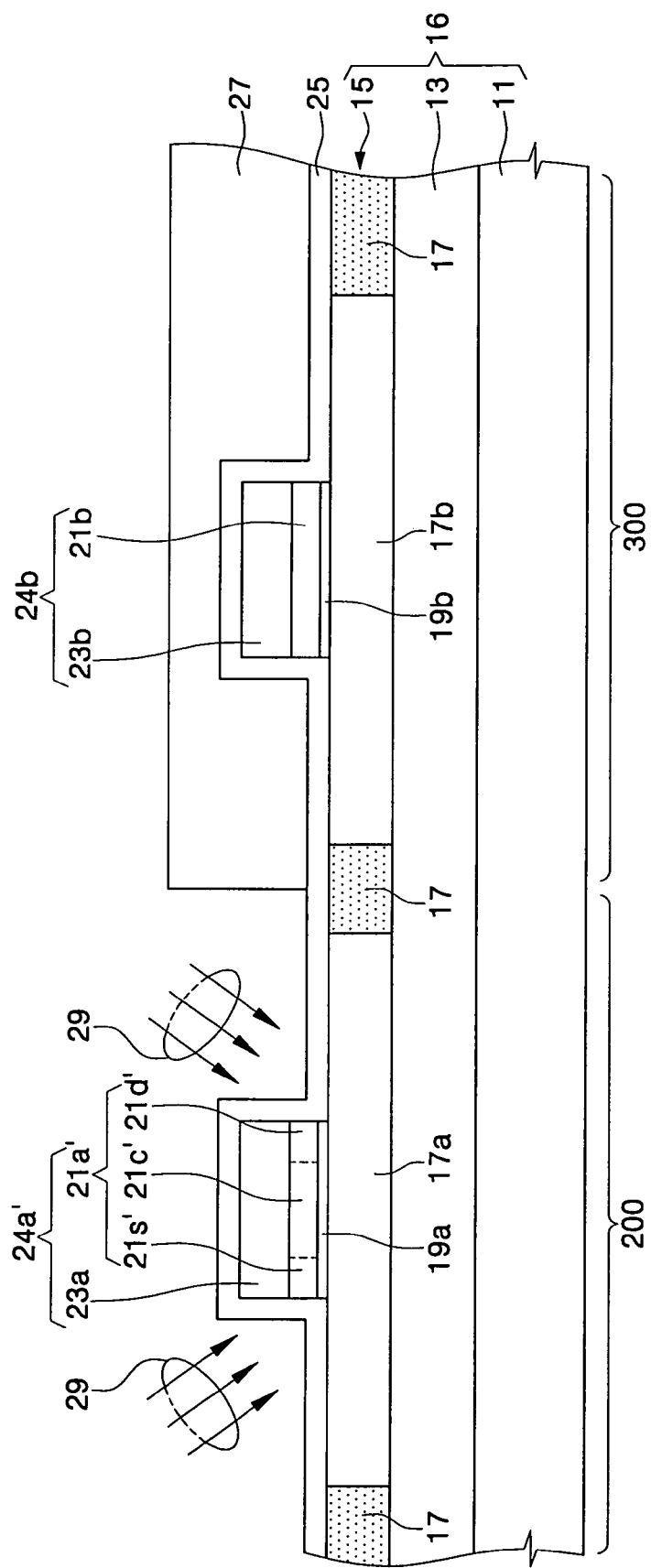

Referring to FIG. 9, a first photoresist pattern 27 covering second region 300 is formed on offset insulation layer 25. First impurities 29 are then implanted into opposite sides of first gate pattern 24a using first photoresist pattern 27 as an ion implantation mask. First impurities 29 are preferably implanted using a tilted ion implantation technique, as shown in FIG. 9. As a result, a first source side gate electrode 21s' and a first drain side gate electrode 21d', which are doped with the first impurities 29, are formed on opposite sides of first metal nitride layer pattern 21a, respectively. In addition, a first central gate electrode 21c' composed of the initial metal nitride layer (that is, the undoped metal nitride layer) is defined between first source side gate electrode 21s' and first drain side gate electrode 21d'. First source side gate electrode 21s' and first drain side gate electrode 21d' are formed to cross over first active region 17a. Accordingly, first central gate electrode 21c' is also formed to cross over first active region 17a.

Where first region 200 is a NMOS transistor region, first impurities 29 generally comprise impurities having an electronegativity less than that of nitrogen. For example, first impurities 29 can be carbon ions having an electronegativity of 2.5. Where first impurities 29 have an electronegativity less than that of nitrogen, first source side gate electrode 21s' and first drain side gate electrode 21d' generally have a work function greater than that of first central gate electrode 21c'.

First source and drain side gate electrodes 21s' and 21d' and first central gate electrode 21c' constitute a first metal nitride gate electrode 21a'. First metal nitride gate electrode 21a' and first top gate electrode 23a constitute a first gate electrode 24a'.

Figure 10:
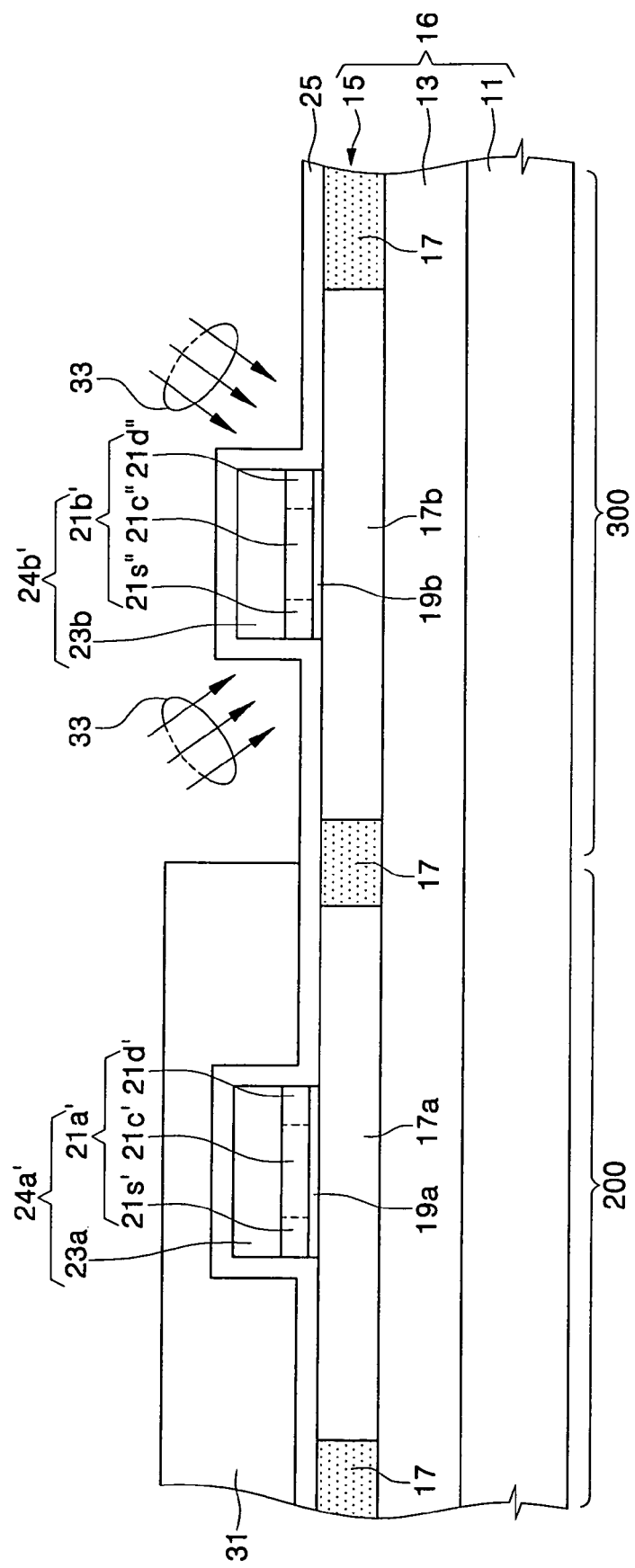

Referring to FIG. 10, first photoresist pattern 27 is removed. Then, a second photoresist pattern 31 is formed on offset insulation layer 25 to cover first region 200. Second impurities 33 are then implanted into opposite sides of second gate pattern 24b using second photoresist pattern 31 as an ion implantation mask. Second impurities 33 are preferably implanted using a tilted ion implantation technique as shown in FIG. 10. As a result, a second source side gate electrode 21s'' and a second drain side gate electrode 21d'' which are doped with second impurities 33 are formed on opposite sides of second metal nitride layer pattern 21b, and a second central gate electrode 21c'' composed of the initial metal nitride layer (i.e., the undoped metal nitride layer) is defined between second source side gate electrode 21s'' and second drain side gate electrode 21d''. Second source side gate electrode 21s'' and second drain side gate electrode 21d'' are formed to cross over second active region 17b, and second central gate electrode 21c'' is also formed to cross over second active region 17b.

Where second region 300 is a PMOS transistor region, second impurities 33 have an electronegativity greater than that of nitrogen. For example, second impurities 33 may be fluorine ions having an electronegativity of 4.0. In this case, second source side gate electrode 21s'' and second drain side gate electrode 21d'' have work function less than that of second central gate electrode 21c''.

Second source and drain side gate electrodes 21s'' and 21d'' and second central gate electrode 21c'' constitute a second metal nitride gate electrode 21b'. Second metal nitride gate electrode 21b' and second top gate electrode 23b constitute a second gate electrode 24b'.

Figure 11:
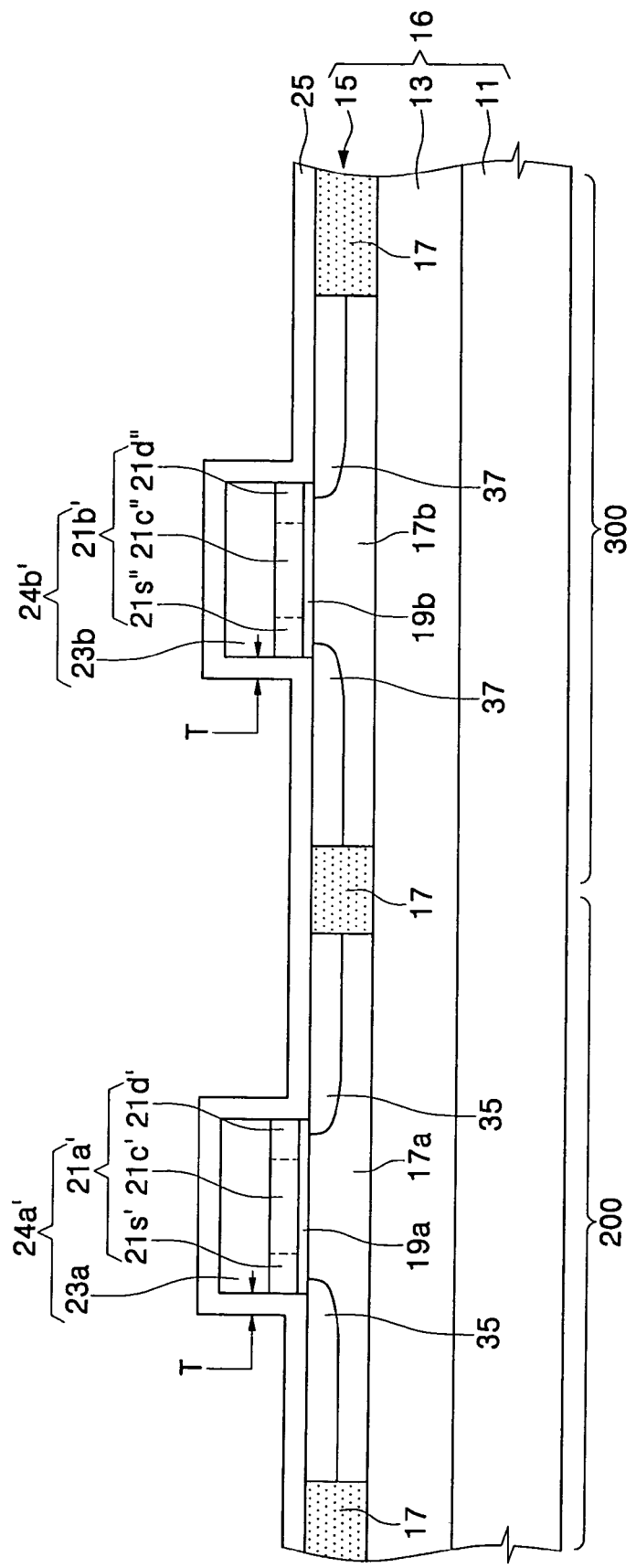

Referring to FIG. 11, second photoresist pattern 31 is removed. Then, N-type dopants are selectively implanted into first active region 17a using first gate electrode 24a' and offset insulation layer 25 on the sidewalls of first gate electrode 24a' as ion implantation masks, thereby forming first low-concentration source and drain regions 35. Similarly, P-type dopants are selectively implanted into second active region 17b using second gate electrode 24b' and offset insulation layer 25 on the sidewalls of second gate electrode 24b' as ion implantation masks, thereby forming second low-concentration source and drain regions 37.

Where first low-concentration source and drain regions 35 fully overlap with the first source and drain side gate electrodes 21s' and 21d', the short channel effect of the NMOS transistor formed in the first region 200 may not be suppressed even though the work function of first source and drain side gate electrodes 21s' and 21d' is greater than the work function of first central gate electrode 21c'. Similarly, where second low-concentration source and drain regions 37 fully overlap with second source and drain side gate electrodes 21s'' and 21d'', the short channel effect of the PMOS transistor formed in second region 300 may not be suppressed even though the work function of second source and drain side gate electrodes 21s'' and 21d'' is less than the work function of second central gate electrode 21c''. Therefore, a thickness "T" of offset insulation layer 25 on the sidewalls of first and second gate electrodes 24a' and 24b' can be determined based on the lateral diffusion of the first low-concentration source and drain regions 35 and the second low-concentration source and drain regions 37. In other words, offset insulation layer 25 may be formed to optimize the overlap widths between low-concentration source and drain regions 35 and 37 and source and drain side gate electrodes 21s', 21s'', 21d' and 21d''. For example, offset insulation layer 25 is preferably conformably formed to a thickness of 100 Å to 200 Å.

In other embodiments of the present invention, the N-type dopants for forming the first low-concentration source and drain regions 35 may be implanted using the first photoresist pattern 27 as an ion implantation mask before or after the implantation of the first impurities 29. Similarly, the P-type dopants for forming the second low-concentration source and drain regions 37 may be implanted using the second photoresist pattern 31 as an ion implantation mask before or after the implantation of the second impurities 33.

Figure 12:
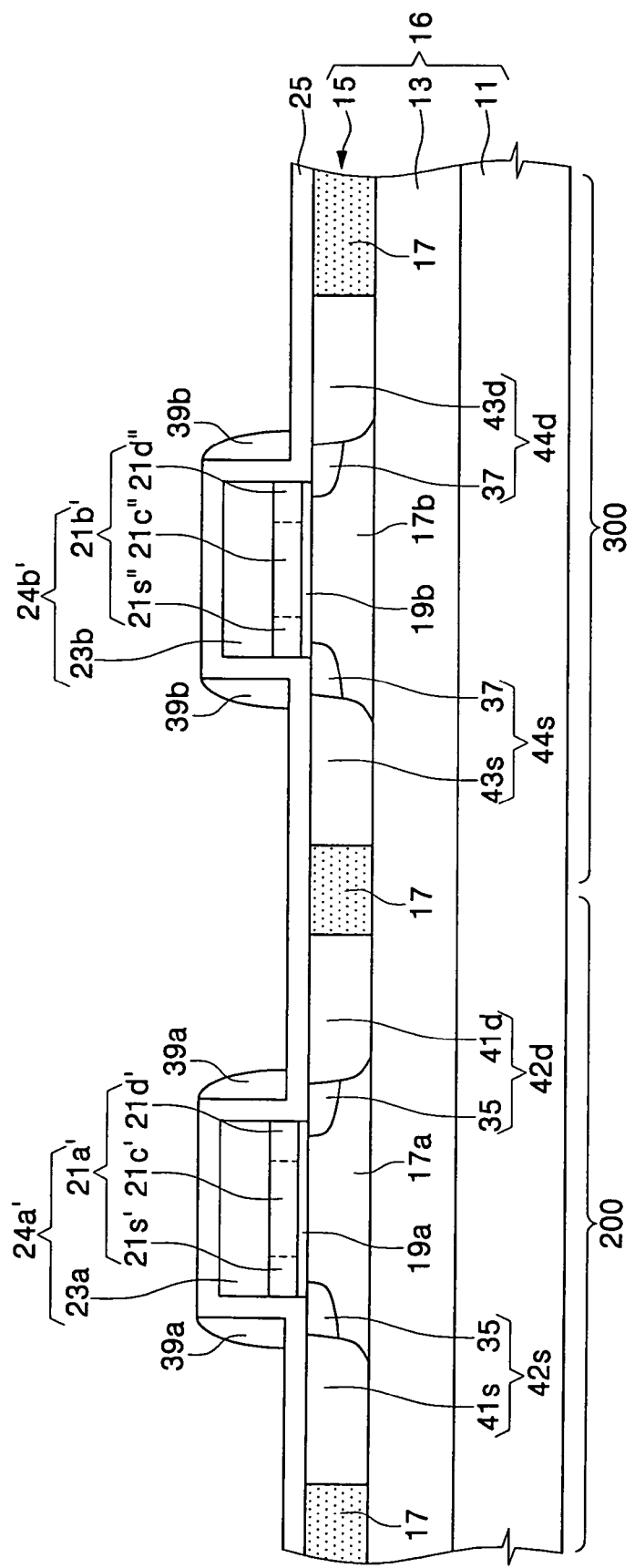

Referring to FIG. 12, a spacer insulation layer is formed on the substrate including the low-concentration source and drain regions 35 and 37, and the spacer insulation layer is anisotropically etched to form first and second spacers 39a and 39b are formed over the sidewalls of the first gate electrode 24a' and the second gate electrode 24b' respectively. The offset insulation layers 25 may be over-etched during the anisotropic etching process for forming for forming the first and second spacers 39a and 39b. In this case, the top surfaces of the first and second gate electrodes 24a' and 24b' and the top surfaces of the low-concentration source and drain regions 35 and 37 may be exposed.

N-type dopants are selectively implanted into first active region 17a using first gate electrode 24a', first gate spacer 39a, and offset insulation layer 25 between first gate electrode 24a' and first gate spacer 39a as ion implantation masks, thereby forming first high-concentration source and drain regions 41s and 41d in semiconductor layer 15. P-type dopants are then implanted into second active region 17b using second gate electrode 24b', second gate spacer 39b, and offset insulation layer 25 between second gate electrode 24b' and second gate spacer 39b as ion implantation masks, thereby forming second high-concentration source and drain regions 43s and 43d. First high-concentration source region 41s and first low-concentration source region 35 adjacent thereto constitute a first source region 42s, and first high-concentration drain region 41d and first low-concentration drain region 35 adjacent thereto constitute a first drain region 42d. Similarly, second high-concentration source region 43s and second low-concentration source region 37 adjacent thereto constitute a second source region 44s, and second high-concentration drain region 43d and second low-concentration drain region 37 adjacent thereto constitute a second drain region 44d.

Now, methods of fabricating fin-type CMOS transistors according to other embodiments of the present invention will be described with reference to again FIG. 5.

Referring to FIG. 5, a SOI substrate is provided. The SOI substrate includes a supporting substrate 101, a buried insulation layer 103 formed on supporting substrate 101 and a semiconductor layer formed on the buried insulation layer 103. In addition, the SOI substrate includes a first region 200 and a second region 300. First and second regions 200 and 300 comprise a NMOS transistor region and a PMOS transistor region, respectively. The semiconductor layer is patterned to form respective first and second fin bodies 105a and 105b protruding upward in respective first and second regions 200 and 300. First and second fin bodies 105a and 105b are generally formed to have the same height as the thickness of the semiconductor layer.

A gate insulation layer is formed on first and second fin bodies 105a and 105b. A gate conductive layer is then formed on the semiconductor substrate over the gate insulation layer. The gate conductive layer is typically formed by sequentially stacking a metal nitride layer and a top gate conductive layer. Alternatively, the gate conductive layer may be formed of only the metal nitride layer. The metal nitride layer and the top gate conductive layer are preferably formed using the methods described with reference to FIGS. 6 to 12.

The gate conductive layer is patterned to form first and second gate patterns that cross over first and second fin bodies 105a and 105b. When the gate conductive layer is formed by sequentially stacking the metal nitride layer and the top gate conductive layer, the first gate pattern includes a first metal nitride layer pattern and a first top gate electrode 111a sequentially stacked and the second gate pattern includes a second metal nitride layer pattern and a second top gate electrode 111b sequentially stacked.

During formation of the first and second gate patterns, the gate insulation layer may be over-etched to expose both ends of fin bodies 105a and 105b adjacent to the gate patterns. In this case, a first gate insulation layer 107a may be left between the first gate pattern and first fin body 105a, and a second gate insulation layer 107b may be left between second gate pattern and second fin body 105b.

A first source side gate electrode 109s' and a first drain side gate electrode 109d' are formed on respective opposite edges of the first metal nitride layer pattern. As a result, a first central gate electrode 109c' is defined between first source side gate electrode 109s' and first drain side gate electrode 109d'. Similarly, a second source side gate electrode 109s" and a second drain side gate electrode 109d" are formed on respective opposing edges of the second metal nitride layer pattern. As a result, a second central gate electrode 109c" is defined between second source side gate electrode 109s" and second drain side gate electrode 109d". First source and drain side gate electrodes 109s' and 109d' and second source and drain side gate electrodes 109s" and 109d" are preferably formed using the methods described with reference to FIGS. 6 to 12.

First source and drain side gate electrodes 109s' and 109d' and first central gate electrode 109c' constitute a first metal nitride gate electrode 109a, and first metal nitride gate electrode 109a and first top gate electrode 111a constitute a first gate electrode 113a. Similarly, second source and drain side gate electrodes 109s" and 109d" and second central gate electrode 109c" constitute a second metal nitride gate electrode 109b, and second metal nitride gate electrode 109b and second top gate electrode 111b constitute a second gate electrode 113b.

Subsequently, a first source region 115s and a first drain region 115d are each formed on opposite sides of first fin body 105a using the methods described with reference to FIGS. 6 to 12. In addition, a second source region 117s and a second drain region 117d are formed on respective opposite sides of second fin body 105b using the methods described with reference to FIGS. 6 to 12.

Figure 13:
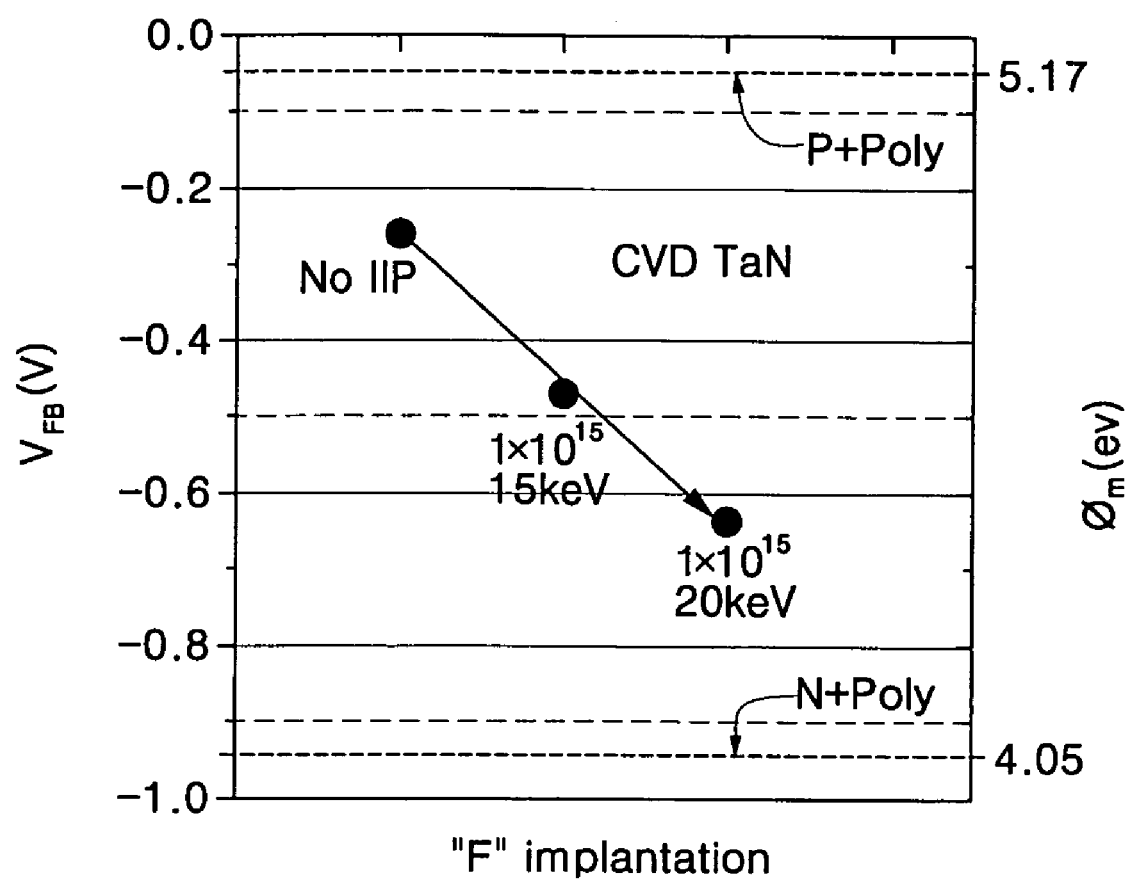
FIG. 13 is a graph illustrating a work function of a tantalum nitride layer according to fluorine ion implantation conditions; and, FIG. 14 is a cross-sectional view illustrating a structure used to simulate threshold voltage characteristics of MOS transistors formed according to conventional methods and according to embodiments of the present invention; and, FIG. 15 is a graph illustrating a simulation of the threshold voltage characteristics of the MOS transistor shown in FIG. 14.

FIG. 13 is a graph illustrating flat band voltages of MOS capacitors employing fluorine-doped tantalum nitride layers or undoped tantalum nitride layers as gate electrodes and work functions of tantalum nitride layers according to fluorine content in the tantalum nitride layers. Each of the MOS capacitors was formed by sequentially stacking a gate oxide layer and a CVD tantalum nitride layer on an N-type silicon substrate having an impurity concentration of 2×1018/cm3, and the gate oxide layer and the CVD tantalum nitride layer were formed to have respective thicknesses of 18 Å and 40 Å. In FIG. 13, the left ordinate denotes a flat band voltage $V_{FB}$ of the MOS capacitor employing the CVD tantalum nitride layer, and the right ordinate denotes a work function $\Phi_m$ of the CVD tantalum nitride layer.

Referring to FIG. 13, the MOS capacitor having an initial CVD tantalum nitride layer (e.g., an undoped CVD tantalum nitride layer) has a flat band voltage of about −0.26V. After fluorine ions are implanted into the CVD tantalum nitride layer with a dose of $1 \times 10^{15}$ atoms/cm$^2$ and an energy of 15 KeV, the MOS capacitor exhibited a flat band voltage of about −0.48V. In addition, when fluorine ions were implanted into the CVD tantalum nitride layer with a dose of $1 \times 10^{15}$ atoms/cm$^2$ and an energy of 20 KeV, the MOS capacitor exhibited a flat band voltage of about −0.64V. As a result, where the fluorine content in the CVD tantalum nitride layer increased, the flat band voltage of the MOS transistor also increases in the negative direction. It can be understood that this is because the work function of the CVD tantalum nitride layer (that is, the fluorine-doped CVD tantalum nitride layer) reduces with an increase of the fluorine content in the CVD tantalum nitride layer as shown in FIGS. 3A, 3B, and 13. Therefore, the fluorine-doped CVD tantalum nitride layer is suitable for a side gate electrode of a PMOS transistor.

Figure 14:
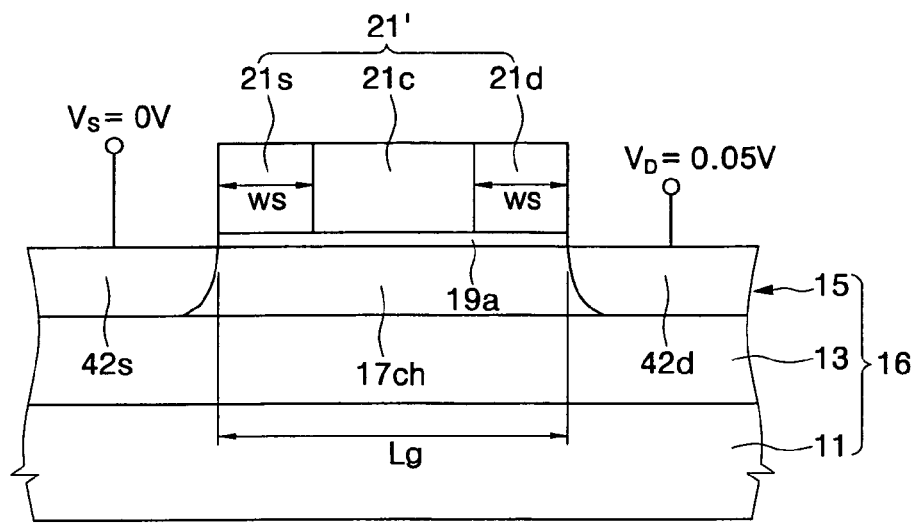

FIG. 14 is a cross-sectional view illustrating the structure of a device used to calculate a threshold voltage of a NMOS transistor according to an embodiment of the present invention.

Referring to FIG. 14, the device comprises a SOI substrate 16 including a supporting substrate 11, a buried oxide layer 13 formed on supporting substrate 11 and a silicon layer formed on buried oxide layer 13. Respective N-type source and drain regions 42s and 42d contacting buried oxide layer 13 are formed in silicon layer 15. Silicon layer 15 has a thickness of 100 Å, and source and drain regions 42s and 42d have a depth of 100 Å. Source and drain regions 42s and 42d are doped with arsenic ions to have an impurity concentration of $5 \times 10^{20}$/cm$^3$.

A gate electrode 21' is disposed on a channel region 17ch between source region 42s and drain region 42d, and gate electrode 21' is electrically insulated from channel region 17ch by a gate oxide layer 19a having a thickness of 13 Å. Gate electrode 21 includes a source side gate electrode 21s adjacent to source region 42s, a drain side gate electrode 21d adjacent to drain region 42d, and a central gate electrode 21c between source side gate electrode 21s and drain side gate electrode 21d.

Source side gate electrode 21s and drain side gate electrode 21d, i.e., "side gate electrodes", each have a width WS of 100 Å. Accordingly, the width of gate electrode 21', or the length of channel region 17ch, is determined by the width of central gate electrode 21c. Central gate electrode 21c is a tantalum nitride layer having a work function of 4.6 eV, and side gate electrodes 21s and 21d are doped tantalum nitride layers having a work function of 4.87 eV. Channel region 17ch has an impurity concentration of $1 \times 10^{10}$/cm3.

Figure 15:
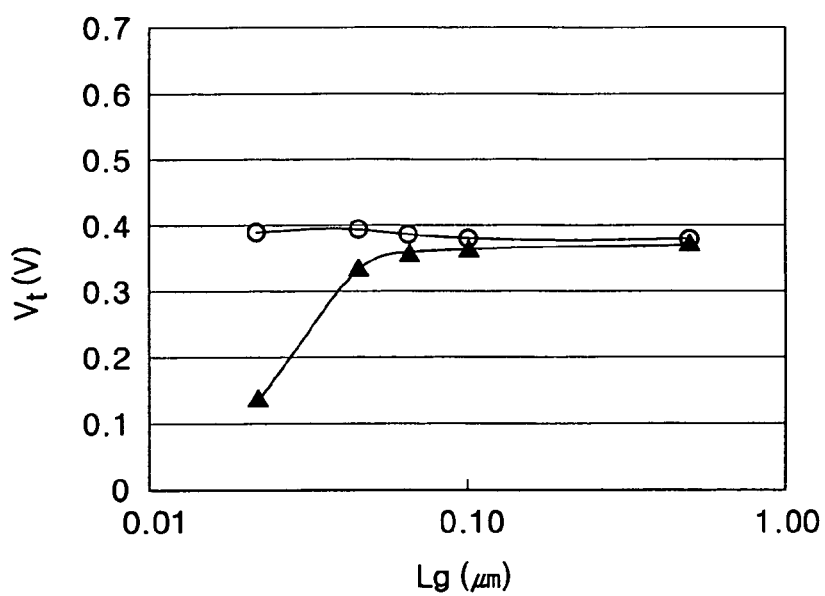

FIG. 15 is a graph showing a simulation result of a threshold voltage characteristic of the NMOS transistor shown in FIG. 14 and a threshold voltage characteristic of a conventional NMOS transistor. The conventional NMOS transistor includes a gate electrode having a single work function of 4.6 eV instead of the dual work function gate electrode 21' shown in FIG. 14. In the graph of FIG. 15, the abscissa denotes a channel length Lg, and the ordinate denotes a threshold voltages $V_t$ of the conventional NMOS transistor and the NMOS transistor according to the present invention. The threshold voltage $V_t$ is a gate voltage measured with a source voltage $V_s$ of 0V and a drain voltage $V_D$ of 0.05V. In FIG. 15, data labeled with a reference symbol "▲" indicates threshold voltages of the conventional NMOS transistor, and data labeled with a reference symbol "○" indicates threshold voltages of the NMOS transistor according to embodiments of the present invention.

As shown in FIG. 15, the threshold voltage of the conventional short channel NMOS transistor having a channel length Lg less than about 0.065 μm was abruptly lowered as compared to the threshold voltage of the conventional long channel NMOS transistor having a channel length Lg greater than 0.1 μm. In contrast, the short channel NMOS transistor according to an embodiment of the present invention having a channel length less than about 0.022 μm still exhibited uniform threshold voltages of about 0.35 to 0.4V.

According to embodiments of the present invention as described above, a pair of side gate electrodes adjacent to source and drain regions comprise a doped metal nitride layer containing first impurities having an electronegativity less than that of nitrogen or second impurities having an electronegativity greater than that of nitrogen, and a central gate electrode between the side gate electrodes is composed of an undoped metal nitride layer having a work function different from that of the doped metal nitride layer. Therefore, when the gate electrode including the doped metal nitride layer and the undoped metal nitride layer is employed in a MOS transistor, it can suppress the short channel effect of the MOS transistor without degradation of current drivability. In addition, the first impurities and the second impurities can be selectively implanted into the NMOS transistor and the PMOS transistor, respectively. Therefore, according to embodiments of the present invention, it is possible to easily fabricate a high-performance CMOS integrated circuit device including NMOS transistors and PMOS transistors.

The foregoing exemplary embodiments are teaching examples. Those of ordinary skill in the art will understand that various changes in form and details may be made to the exemplary embodiments without departing from the scope of the present invention as defined by the following claims.

What is claimed is:

1. A metal-oxide semiconductor (MOS) transistor, comprising a gate electrode comprising at least one metal nitride formed over a channel region disposed in a semiconductor substrate, the gate electrode comprising:
a central gate electrode, and source side and drain side gate electrodes formed on opposite sides of the central gate electrode, wherein the source and drain side gate electrodes comprise carbon ions, such that the source and drain side gate electrodes have respective work functions different from a work function of the central gate electrode.

2. A metal-oxide semiconductor (MOS) transistor comprising:
a metal nitride gate electrode formed over a channel region disposed in a semiconductor substrate, the metal nitride gate electrode comprising; a central gate electrode, and source side and drain side gate electrodes formed on opposite sides of the central gate electrode,
wherein the source and drain side gate electrodes contain either first impurities having an electronegativity less than that of nitrogen or second impurities having an electronegativity greater than that of nitrogen, such that the source and drain side gate electrodes have respective work functions different from a work function of the central gate electrode;
a gate spacer disposed on sidewalls of the metal nitride gate electrode; and
an offset insulation layer formed between the gate spacer and the metal nitride gate electrode.

3. The MOS transistor of claim 2, wherein the offset insulation layer has a thickness between 100 Å and 200 Å.

4. A metal-oxide semiconductor (MOS) transistor comprising:
a metal nitride gate electrode formed over a channel region disposed in a semiconductor substrate, the metal nitride gate electrode comprising; a central gate electrode, and source side and drain side gate electrodes formed on opposite sides of the central gate electrode,
wherein the source and drain side gate electrodes contain either first impurities having an electronegativity less than that of nitrogen or second impurities having an electronegativity greater than that of nitrogen, such that the source and drain side gate electrodes have respective work functions different from a work function of the central gate electrode;
a top gate electrode formed on the metal nitride gate electrode;
a gate spacer disposed on sidewalls of the metal nitride gate electrode and the top gate electrode; and
an offset insulation layer disposed between the metal nitride gate electrode and the gate spacer.

5. The MOS transistor of claim 4, wherein the metal nitride gate electrode has a thickness between 5 Å and 20 Å.

6. The MOS transistor of claim 4, wherein the top gate electrode comprises a semiconductor gate pattern having a thickness between 1000 Å and 2000 Å.

7. The MOS transistor of claim 4, wherein the offset insulation layer has a thickness between 100 Å and 200 Å.

8. A complementary metal-oxide semiconductor (CMOS) integrated circuit device, comprising:
a semiconductor substrate having a first region and a second region;
a first source region and a first drain region formed in the first region, and a first channel region formed between the first source region and the first drain region;
a first metal nitride gate electrode formed on the first channel region, the first metal nitride gate electrode including a first source side gate electrode formed adjacent to the first source region, a first drain side gate electrode formed adjacent to the first drain region, and a first central gate electrode formed between the first source side gate electrode and the first drain side gate electrode,
wherein the first source side gate electrode and the first drain side gate electrode contain first impurities comprising carbon ions having an electronegativity less than that of nitrogen and a work function greater than that of the first central gate electrode;
a second source region and a second drain region formed in the second region, and a second channel region formed between the second source region and the second drain region;
a second metal nitride gate electrode formed on the second channel region,
the second metal nitride gate electrode including a second source side gate electrode formed adjacent to the second source region,
a second drain side gate electrode formed adjacent to the second drain region, and a second central gate electrode formed between the second source side gate electrode and the second drain side gate electrode,
wherein the second source side gate electrode and the second drain side gate electrode contain second impurities having an electronegativity greater than that of nitrogen and a work function less than that of the second central gate electrode.

9. The CMOS integrated circuit device of claim 8, wherein the semiconductor substrate comprises a Silicon On Insulator (SOI) substrate or a bulk silicon substrate.

10. The CMOS integrated circuit device of claim 8, wherein the first region is an N conductivity type metal-oxide semiconductor (NMOS) transistor region and the second region is a P conductivity type metal-oxide semiconductor (PMOS) transistor region.

11. The CMOS integrated circuit device of claim 8, wherein the metal nitride is transition metal nitride.

12. The CMOS integrated circuit device of claim 11, wherein the transition metal nitride is tantalum nitride or titanium nitride.

13. The CMOS integrated circuit device of claim 8, further comprising:
a first gate spacer disposed on sidewalls of the first metal nitride gate electrode; and,
a second gate spacer disposed on sidewalls of the second metal nitride gate electrode.

14. The CMOS integrated circuit device of claim 13, further comprising:
an offset insulation layer interposed between the first gate spacer and the first metal nitride gate electrode and between the second gate spacer and the second metal nitride gate electrode.

15. The CMOS integrated circuit device of claim 14, wherein the offset insulation layer has a thickness between 100 Å and 200 Å.

16. The CMOS integrated circuit device of claim 8, wherein the first and second metal nitride gate electrodes have a thickness between 5 Å and 20 Å.

17. The CMOS integrated circuit device of claim 8, further comprising:
a first gate spacer disposed on sidewalls of a first gate electrode including the first metal nitride gate electrode and the first top gate electrode; and,
a second gate spacer disposed on sidewalls of a second gate electrode including the second metal nitride gate electrode and the second top gate electrode.

18. The CMOS integrated circuit device of claim 17, further comprising:
an offset insulation layer formed between the first gate spacer and the first gate electrode, and between the second gate spacer and the second gate electrode.

19. The CMOS integrated circuit device of claim 18, wherein the offset insulation layer has a thickness between 100 Å and 200 Å.

20. A complementary metal-oxide semiconductor (CMOS) integrated circuit device, comprising:
a semiconductor substrate having a first region and a second region;
a first fin body protruding upward from the semiconductor substrate and formed in the first region;
a first source region and a first drain region formed in the first fin body and a first channel region formed in the first fin body between the first source region and the first drain region;
a first metal nitride gate electrode formed to cover opposite sidewalls and a top surface of the first channel region, the first metal nitride gate electrode including a first source side gate electrode adjacent to the first source region, a first drain side gate electrode adjacent to the first drain region, and a first central gate electrode between the first source side gate electrode and the first drain side gate electrode,
wherein the first source side gate electrode and the first drain side gate electrode contain first impurities comprising carbon ions having an electronegativity less than that of nitrogen and a work function greater than that of the first central gate electrode;
a second fin body protruding upward from the semiconductor substrate and formed in the second region;
a second source region and a second drain region formed in the second fin body and a second channel region formed in the second fin body between the second source region and the second drain region; and,
a second metal nitride gate electrode formed to cover opposite sidewalls and a top surface of the second channel region, the second metal nitride gate electrode including a second source side gate electrode adjacent to the second source region, a second drain side gate electrode adjacent to the second drain region, and a second central gate electrode between the second source side gate electrode and the second drain side gate electrode,
wherein the second source side gate electrode and the second drain side gate electrode contain second impurities having an electronegativity greater than that of nitrogen and a work function less than that of the second central gate electrode.

21. The CMOS integrated circuit device of claim 20, wherein the semiconductor substrate comprises a Silicon On Insulator (SOI) substrate including a supporting substrate, a buried insulation layer formed on the supporting substrate, and a semiconductor layer formed on the buried insulation layer, wherein the first and second fin bodies comprise semiconductor patterns composed of predetermined regions of the semiconductor layer.

22. The CMOS integrated circuit device of claim 20, further comprising:
a first gate insulation layer interposed between the first metal nitride gate electrode and the first channel region, wherein the first gate insulation layer comprises a first sidewall gate insulation layer formed on opposite sidewalls of the first channel region and a first top gate insulation layer formed on a top surface of the first channel region; and,
a second gate insulation layer interposed between the second metal nitride gate electrode and the second channel region, wherein the second gate insulation layer includes a second sidewall gate insulation layer formed on respective opposite sidewalls of the second channel region and a second top gate insulation layer formed on a top surface of the second channel region.

23. The CMOS integrated circuit device of claim 22, wherein the first top gate insulation layer is thicker than the first sidewall gate insulation layer and the second top gate insulation layer is thicker than the second sidewall gate insulation layer.

24. The CMOS integrated circuit device of claim 20, wherein the metal nitride comprises transition metal nitride.

25. The CMOS integrated circuit device of claim 24, wherein the transition metal nitride comprises tantalum nitride or titanium nitride.

26. The CMOS integrated circuit device of claim 20, wherein the first and second metal nitride gate electrodes have respective thicknesses between 5 Å and 20 Å.

27. The MOS transistor of claim 1, wherein the semiconductor substrate comprises a Silicon On Insulator (SOI) substrate or a bulk silicon substrate.

28. The MOS transistor of claim 1, wherein the at least one metal nitride comprises at least one transition metal nitride.

29. The MOS transistor of claim 28, wherein the transition metal nitride comprises tantalum nitride or titanium nitride.

30. The MOS transistor of claim 1, further comprising:
a gate spacer disposed on sidewalls of the gate electrode.

31. The MOS transistor of claim 30, further comprising:
an offset insulation layer formed between the gate spacers and the gate electrode.

32. The MOS transistor of claim 1, further comprising:
a top gate electrode formed on the gate electrode.

33. The MOS transistor of claim 2, wherein the semiconductor substrate comprises a Silicon On Insulator (SOI) substrate or a bulk silicon substrate.

34. The MOS transistor of claim 2, wherein the metal nitride forming the metal nitride gate electrode is a transition metal nitride.

35. The MOS transistor of claim 34, wherein the transition metal nitride comprises tantalum nitride or titanium nitride.

36. A complementary metal-oxide semiconductor (CMOS) integrated circuit device, comprising:
a semiconductor substrate having a first region and a second region;
a first fin body protruding upward from the semiconductor substrate and formed in the first region;
a first source region and a first drain region formed in the first fin body and a first channel region formed in the first fin body between the first source region and the first drain region;
a first metal nitride gate electrode formed to cover opposite sidewalls and a top surface of the first channel region,
the first metal nitride gate electrode including a first source side gate electrode adjacent to the first source region, a first drain side gate electrode adjacent to the first drain region, and a first central gate electrode between the first source side gate electrode and the first drain side gate electrode,
wherein the first source side gate electrode and the first drain side gate electrode contain first impurities having an electronegativity less than that of nitrogen and a work function greater than that of the first central gate electrode;
a second fin body protruding upward from the semiconductor substrate and formed in the second region;
a second source region and a second drain region formed in the second fin body and a second channel region formed in the second fin body between the second source region and the second drain region;
a second metal nitride gate electrode formed to cover opposite sidewalls and a top surface of the second channel region, the second metal nitride gate electrode including a second source side gate electrode adjacent to the second source region, a second drain side gate electrode adjacent to the second drain region, and a second central gate electrode between the second source side gate electrode and the second drain side gate electrode,
wherein the second source side gate electrode and the second drain side gate electrode contain second impurities comprising fluorine ions having an electronegativity greater than that of nitrogen and a work function less than that of the second central gate electrode;
a first gate insulation layer interposed between the first metal nitride gate electrode and the first channel region, wherein the first gate insulation layer comprises a first sidewall gate insulation layer formed on opposite sidewalls of the first channel region and a first top gate insulation layer formed on a top surface of the first channel region; and
a second gate insulation layer interposed between the second metal nitride gate electrode and the second channel region, wherein the second gate insulation layer includes a second sidewall gate insulation layer formed on respective opposite sidewalls of the second channel region and a second top gate insulation layer formed on a top surface of the second channel region,
wherein the first top gate insulation layer is thicker than the first sidewall gate insulation layer and the second top gate insulation layer is thicker than the second sidewall gate insulation layer.

* * * * *